US008810005B1

(12) United States Patent
Camillo-Castillo et al.

(10) Patent No.: US 8,810,005 B1
(45) Date of Patent: Aug. 19, 2014

(54) BIPOLAR DEVICE HAVING A MONOCRYSTALLINE SEMICONDUCTOR INTRINSIC BASE TO EXTRINSIC BASE LINK-UP REGION

(71) Applicant: International Business Machines Corporation, Armonk, NY (US)

(72) Inventors: Renata A. Camillo-Castillo, Essex Junction, VT (US); Peng Cheng, South Burlington, VT (US); Peter B. Gray, Jericho, VT (US); Vibhor Jain, Essex Junction, VT (US); Vikas K. Kaushal, Essex Junction, VT (US); Marwan H. Khater, Astoria, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/782,094

(22) Filed: Mar. 1, 2013

(51) Int. Cl.
*H01L 29/66* (2006.01)
*H01L 29/10* (2006.01)
*H01L 29/737* (2006.01)
*H01L 29/732* (2006.01)

(52) U.S. Cl.
CPC ...... *H01L 29/1004* (2013.01); *H01L 29/66234* (2013.01); *H01L 29/66242* (2013.01); *H01L 29/7371* (2013.01); *H01L 29/732* (2013.01)
USPC ............................ 257/592; 257/197; 257/565

(58) Field of Classification Search
CPC ..................... H01L 29/1004; H01L 29/66234; H01L 29/66242; H01L 29/7371; H01L 29/732
USPC ......................................... 257/592, 197, 565
See application file for complete search history.

(56) References Cited

U.S. PATENT DOCUMENTS

| | | | |
|---|---|---|---|
| 4,523,370 A | 6/1985 | Sullivan et al. | |
| 4,849,371 A | 7/1989 | Hansen et al. | |
| 4,981,806 A | 1/1991 | Maas et al. | |
| 5,213,988 A | 5/1993 | Yamauchi et al. | |
| 5,629,556 A * | 5/1997 | Johnson | 257/592 |
| 5,654,211 A * | 8/1997 | Ham | 438/367 |
| 5,668,396 A * | 9/1997 | Sato | 257/517 |
| 6,239,477 B1 * | 5/2001 | Johnson | 257/592 |
| 6,521,974 B1 * | 2/2003 | Oda et al. | 257/593 |
| 6,541,336 B1 | 4/2003 | Cantell et al. | |
| 6,777,302 B1 * | 8/2004 | Chen et al. | 438/335 |
| 6,972,443 B2 | 12/2005 | Khater | |
| 7,045,876 B2 | 5/2006 | An et al. | |
| 7,932,155 B2 | 4/2011 | Dunn et al. | |
| 2008/0121930 A1 | 5/2008 | Adam et al. | |
| 2008/0265282 A1 | 10/2008 | Gluschenkov et al. | |
| 2009/0020851 A1 * | 1/2009 | Liu et al. | 257/565 |
| 2009/0179228 A1 * | 7/2009 | Joseph et al. | 257/197 |

* cited by examiner

*Primary Examiner* — Eva Yan Montalvo
(74) *Attorney, Agent, or Firm* — Gibb & Riley, LLC; Michael J. LeStrange, Esq.

(57) ABSTRACT

A bipolar device with an entirely monocrystalline intrinsic base to extrinsic base link-up region. To form the device, a first extrinsic base layer, which is amorphous or polycrystalline, is deposited such that it contacts an edge portion of a monocrystalline section of an intrinsic base layer through an opening in a dielectric layer. A second extrinsic base layer is deposited on the first. An anneal is performed, either before or after deposition of the second extrinsic base layer, so that the extrinsic base layers are monocrystalline. An opening is formed through the extrinsic base layers to a dielectric landing pad aligned above a center portion of the monocrystalline section of the intrinsic base layer. The dielectric landing pad is removed and a semiconductor layer is grown epitaxially on exposed monocrystalline surfaces of the extrinsic and intrinsic base layers, thereby forming the entirely monocrystalline intrinsic base to extrinsic base link-up region.

12 Claims, 13 Drawing Sheets

US 8,810,005 B1

BIPOLAR DEVICE HAVING A MONOCRYSTALLINE SEMICONDUCTOR INTRINSIC BASE TO EXTRINSIC BASE LINK-UP REGION

BACKGROUND

1. Field of the Invention

The embodiments disclosed herein relate to bipolar devices (e.g., bipolar junction transistors (BJTs) and heterojunction bipolar transistors (HBTs)) and, more particularly, to a bipolar device incorporating a monocrystalline semiconductor intrinsic base to extrinsic base link-up region and to a method of forming such a bipolar device.

2. Description of the Related Art

As discussed in U.S. Pat. No. 6,972,443 issued on Dec. 6, 2005 to Khater, assigned to International Business Machines Corporation and incorporated herein by reference, it is desirable in bipolar devices, such as bipolar junction transistors (BJTs) and, particularly, in high performance heterojunction bipolar transistors (HBTs), to have a relatively high transit frequency $f_T$ and maximum oscillation frequency $f_{max}$. $f_{max}$ is a function of $f_T$ and parasitic resistances and capacitances. One such parasitic resistance is the base resistance $R_b$. Reduction of this base resistance $R_b$ can result in a higher $f_{max}$. Thus, it would be advantageous to provide a bipolar device, such as a bipolar junction transistor (BJT) or heterojunction bipolar transistor (HBT), with reduced base resistance $R_b$ and a method for forming such bipolar device.

SUMMARY

In view of the foregoing, disclosed herein are embodiments of a bipolar device, such as a bipolar junction transistor (BJT) or heterojunction bipolar transistor (HBT), incorporating a link-up region that is entirely monocrystalline in structure and that electrically connects a monocrystalline section of an intrinsic base layer with monocrystalline extrinsic base layers for a reduction in overall base resistance $R_b$ for a higher $f_{max}$. Also disclosed herein are embodiments of a method of forming such a bipolar device. In these method embodiments, a first extrinsic base layer, which is initially amorphous or polycrystalline, can be deposited such that it contacts an edge portion of a monocrystalline section of an intrinsic base layer through an opening in a dielectric layer. A second extrinsic base layer can be deposited on the first extrinsic base layer. An anneal process can be performed, either before or after epitaxial deposition of the second extrinsic base layer, to ensure that the extrinsic base layers are both monocrystalline. An emitter opening can then be formed through the extrinsic base layers to a dielectric landing pad, which is aligned above a center portion of the monocrystalline section of the intrinsic base layer. The dielectric landing pad can be selectively removed and, following removal of the dielectric landing pad, a semiconductor layer can be epitaxially deposited on exposed monocrystalline surfaces only of the extrinsic base layers and the intrinsic base layer, thereby forming a link-up region, which is entirely monocrystalline in structure, between the intrinsic base layer and the extrinsic base layers.

More particularly, disclosed herein are embodiments of a bipolar device, such as a bipolar junction transistor (BJTs) or heterojunction bipolar transistor (HBT). The bipolar device can comprise at least an intrinsic base layer, multiple extrinsic base layers and a semiconductor layer comprising an entirely monocrystalline link-up region between the intrinsic base layer and the extrinsic base layers.

The intrinsic base layer can comprise a monocrystalline section having a first center portion and a first edge portion positioned laterally adjacent to the first center portion. The intrinsic base layer can further comprise a polycrystalline section positioned laterally adjacent to the first edge portion of the monocrystalline section. A dielectric layer can be positioned on the top surface of the polycrystalline section of the intrinsic base layer.

The semiconductor layer can be positioned on the top surface of the first center portion of the monocrystalline section of the intrinsic base layer. The semiconductor layer can further have a second center portion, a second edge portion positioned laterally adjacent to the second center portion and a vertical extension offset from the second edge portion (e.g., positioned laterally between the second edge portion and the second center portion and extending upward).

The multiple extrinsic base layers can comprise a first extrinsic base layer and a second extrinsic base layer. The first extrinsic base layer can be positioned on the dielectric layer and can further extend laterally over the top surface of the first edge portion of the monocrystalline section of the intrinsic base layer and the top surface of the second edge portion of the semiconductor layer. This first extrinsic base layer can further extend laterally so that it abuts the vertical extension of the semiconductor layer. This first extrinsic base layer can be monocrystalline in structure. The second extrinsic base layer can be positioned on the top surface of the first extrinsic base layer and, like the first extrinsic base layer, can extend laterally to (i.e., can abut) the vertical extension of the semiconductor layer. Thus, the first extrinsic base layer and the second extrinsic base layer can have vertically aligned sidewalls immediately adjacent to (i.e., abutting) a vertical sidewall of the vertical extension of the semiconductor layer.

In the embodiments described above, the second edge portion and vertical extension of the semiconductor layer can be entirely monocrystalline in structure and, thereby can form an entirely monocrystalline link-up region between the intrinsic base layer and the multiple extrinsic base layers.

Additionally, it should be noted that, depending upon the embodiment, the second extrinsic base layer can be entirely monocrystalline or, alternatively, at least the section of the second extrinsic base layer that extends laterally over the top surfaces of the first edge portion of the monocrystalline section of the intrinsic base layer and the second edge portion of the semiconductor layer can be monocrystalline in structure.

Specifically, in one embodiment, the first extrinsic base layer and the second extrinsic base layer can have vertically aligned sidewalls adjacent to the vertical extension of the semiconductor layer and can further be patterned so as to have additional vertically aligned sidewalls above the dielectric layer (e.g., some predetermined distance from the interface between the first extrinsic base layer and the first edge portion of the monocrystalline section of the intrinsic base layer). In this case, the first and second extrinsic base layers will be entirely monocrystalline in structure, due to the process techniques used to form the device as described in detail below with regard to the method embodiments.

In another embodiment, the first extrinsic base layer and the second extrinsic base layer can have vertically aligned sidewalls adjacent to the vertical extension of the semiconductor layer and the first extrinsic base layer alone can further be patterned so as to have an additional vertical sidewall above the dielectric layer (e.g., some predetermined distance from the interface between the first extrinsic base layer and the first edge portion of the monocrystalline section of the intrinsic base layer). In this case, the first extrinsic base layer can be entirely monocrystalline and the second extrinsic base layer can comprise an additional monocrystalline section aligned above the first extrinsic base layer and an additional polycrystalline section aligned above the dielectric layer and positioned laterally adjacent to the additional monocrystalline section.

Also disclosed herein are embodiments of a method of forming the above-described bipolar device embodiments. The method embodiments can comprise forming an intrinsic base layer such that the intrinsic base layer comprises a monocrystalline section and a polycrystalline section positioned laterally adjacent to the monocrystalline section. The monocrystalline section can have a first center portion and a first edge portion positioned laterally between the first center portion and the polycrystalline section.

After the intrinsic base layer is formed, a dielectric layer can be formed on the intrinsic base layer. A first opening can be formed in the dielectric layer aligned above the first edge portion of the monocrystalline section of the intrinsic base layer. Formation of this first opening forms a dielectric landing pad on the first center portion of the monocrystalline section of the intrinsic base layer, exposes the first edge portion of the monocrystalline section of the intrinsic base layer and leaves a remaining portion of the dielectric layer on the polycrystalline section of the intrinsic base layer.

Next, a first extrinsic base layer can be formed over the dielectric layer such that it lines the first opening (i.e., such that it is immediately adjacent to the first edge portion of the monocrystalline section of the intrinsic base layer within the first opening) and such that it further extends laterally onto the dielectric landing pad. This first extrinsic base layer can be formed such that it is initially amorphous or polycrystalline in structure.

In one particular embodiment, after the first extrinsic base layer is formed, an anneal process can be performed so that the first extrinsic base layer becomes monocrystalline in structure (i.e., to crystallize the first extrinsic base layer using the first edge portion of the monocrystalline section of the intrinsic base layer within the first opening as a seed layer). Then, a second extrinsic base layer can be deposited on the first extrinsic base layer. Since the first extrinsic base layer is monocrystalline in structure due to the anneal process, the second extrinsic base layer will similarly be monocrystalline in structure. Optionally, prior to depositing the second extrinsic base layer (e.g., before the anneal process), the first extrinsic base layer can be patterned so as to have a vertical sidewall above the dielectric layer (e.g., some predetermined distance from the first opening in the dielectric layer). In this case, epitaxial deposition of the extrinsic base layer will result in the extrinsic base layer comprising an additional monocrystalline section on the first extrinsic base layer and an additional polycrystalline section on the top surface of the dielectric layer and positioned laterally adjacent to the additional monocrystalline section.

In another particular embodiment, after the first extrinsic base layer is formed on the dielectric layer and, particularly, before any anneal process is performed, a second extrinsic base layer can be deposited on the first extrinsic base layer. Since the first extrinsic base layer is still amorphous or polycrystalline in structure at this time, the second extrinsic base layer as deposited will similarly be amorphous or polycrystalline in structure. Then, after the second extrinsic base layer is deposited, an anneal process can be performed so that the first extrinsic base layer and second extrinsic base layer both become monocrystalline in structure (i.e., to crystallize both the first extrinsic base layer and the second extrinsic base layer using the first edge portion of the monocrystalline section of the intrinsic base layer within the first opening as a seed layer). Optionally, prior to the anneal process, the first extrinsic base layer and second extrinsic base layer can be patterned so as to have vertically aligned sidewalls above the dielectric layer (e.g., some predetermined distance from the first opening in the dielectric layer). In this case, patterning of the first extrinsic base layer and second extrinsic base layer ensures that the both of the extrinsic base layers will be entirely monocrystalline in structure following the anneal process.

After the second extrinsic base layer is formed, a second opening and, particularly, an emitter opening can be formed that extends through the second extrinsic base layer and the first extrinsic base layer to the dielectric landing pad and the dielectric landing pad can be selectively removed. As a result of the process steps described above, removal of the dielectric landing pad exposes only monocrystalline surfaces of the first extrinsic base layer, the second extrinsic base layer and the intrinsic base layer. Then, following removal of the dielectric landing pad, a semiconductor layer can be epitaxially deposited on the exposed monocrystalline surfaces such that the semiconductor layer is above the monocrystalline section of the intrinsic base layer, is entirely monocrystalline in structure and has a second center portion, a second edge portion positioned laterally adjacent to the second center portion and stacked vertically between the intrinsic base layer and the first extrinsic base layer and a vertical extension offset from the second edge portion and positioned laterally adjacent to the vertically aligned sidewalls of the first extrinsic base layer and the second extrinsic base layer and, thereby such that the second edge portion and the vertical extension of the semiconductor layer form an entirely monocrystalline link-up region between the intrinsic base layer and the first and second extrinsic base layers.

BRIEF DESCRIPTION OF THE DRAWINGS

The embodiments herein will be better understood from the following detailed description with reference to the drawings, which are not necessarily drawn to scale and in which.

DETAILED DESCRIPTION

Figure 1:
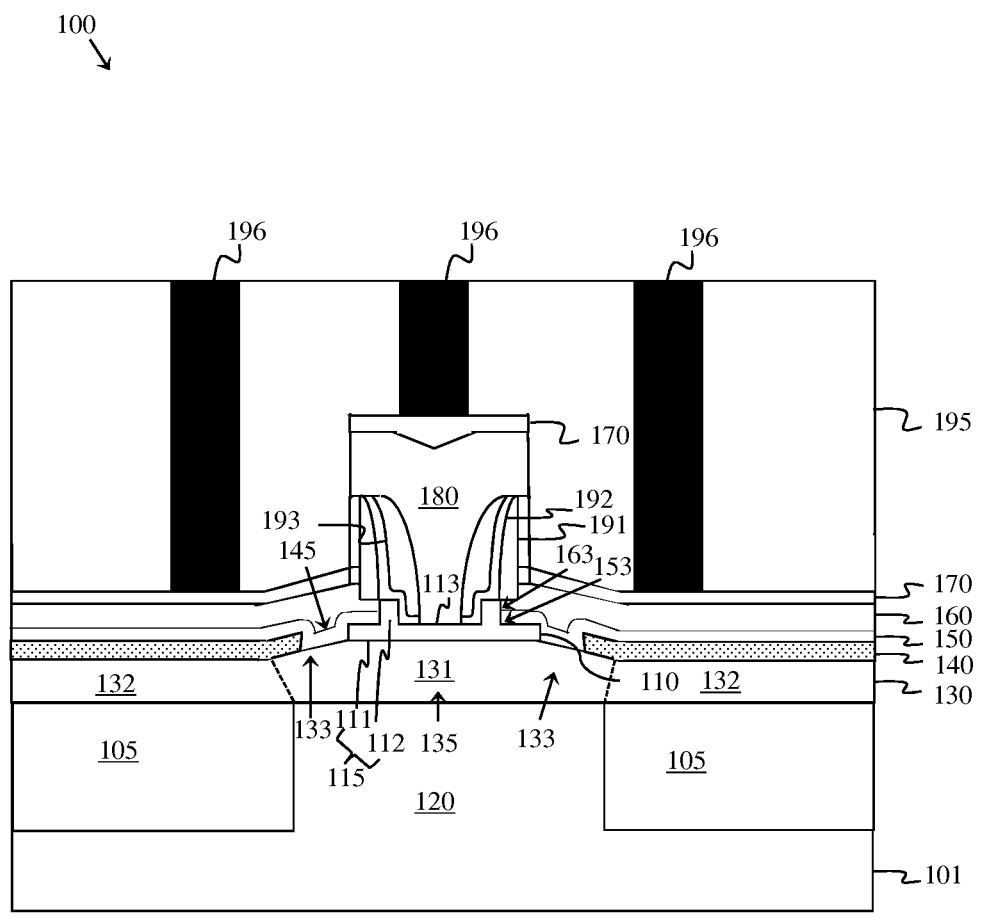
FIG. 1 is a cross-section diagram illustrating an embodiment of a bipolar device.

As mentioned above, it is desirable in bipolar devices, such as bipolar junction transistors (BJTs) and, particularly, in high performance heterojunction bipolar transistors (HBTs), to have a relatively high transit frequency $f_T$ and maximum oscillation frequency $f_{max}$. $f_{max}$ is a function of $f_T$ and parasitic resistances and capacitances. One such parasitic resistance is the base resistance $R_b$.

Current techniques for forming bipolar devices typically result in a structure having a monocrystalline section of an intrinsic base layer electrically connected to a polycrystalline semiconductor extrinsic base layer by a link-up region. The link-up region is typically formed by forming an emitter opening that extends vertically through the extrinsic base layer to a dielectric landing pad, which is wider than the emitter opening and aligned above the monocrystalline section of the intrinsic base layer. The dielectric landing pad is then selectively removed, thereby exposing a horizontal surface of the monocrystalline section of the intrinsic base layer as well a horizontal surface and vertical surfaces of the polycrystalline extrinsic base layer. Next, a semiconductor material is epitaxially deposited on the exposed surfaces of the intrinsic and extrinsic base layers until the cavity created by removal of the dielectric landing pad is filled, thereby forming the link-up region. Since the semiconductor material for the link-up region is epitaxially deposited on surfaces of polycrystalline and monocrystalline semiconductor material, the resulting link-up region comprises a combination of both polycrystalline and monocrystalline semiconductor material. Unfortunately, due to the random nature of polycrystalline semiconductor growth in terms of grain size and orientation, this epitaxial deposition process inevitably results in a non-uniform interface between the polycrystalline and monocrystalline semiconductor material within the link-up region as well as the creation of voids at that non-uniform interface. In such a structure, relatively high overall base resistance $R_b$ is the result of high sheet resistance of the polycrystalline semiconductor material in the extrinsic base and adjacent portion of the link-up region as well as the presence of voids within the link-up region.

In view of the foregoing, disclosed herein are embodiments of a bipolar device, such as a bipolar junction transistor (BJT) or heterojunction bipolar transistor (HBT), incorporating a link-up region that is entirely monocrystalline in structure and electrically connects a monocrystalline section of an intrinsic base layer with monocrystalline semiconductor extrinsic base layers for a reduction in overall base resistance $R_b$ for a higher $f_{max}$. Also disclosed herein are embodiments of a method of forming such a bipolar device. In these method embodiments, a first extrinsic base layer, which is initially amorphous or polycrystalline, can be deposited such that it contacts an edge portion of a monocrystalline section of an intrinsic base layer through an opening in a dielectric layer. A second extrinsic base layer can be deposited on the first extrinsic base layer. An anneal process can be performed, either before or after epitaxial deposition of the second extrinsic base layer, to ensure that the extrinsic base layers are both monocrystalline. An emitter opening can then be formed through the extrinsic base layers to a dielectric landing pad, which is aligned above a center portion of the monocrystalline section of the intrinsic base layer. The dielectric landing pad can be selectively removed and, following removal of the dielectric landing pad, a semiconductor layer can be epitaxially deposited on exposed monocrystalline surfaces only of the extrinsic base layers and the intrinsic base layer, thereby forming a link-up region, which is entirely monocrystalline in structure, between the intrinsic base layer and the extrinsic base layers.

More particularly, referring to FIG. 1, disclosed herein are embodiments of a bipolar device 100, such as a bipolar junction transistor (BJT) or heterojunction bipolar transistor (HBT). This bipolar device 100 can comprise at least an intrinsic base layer 130, multiple extrinsic base layers (i.e., a first extrinsic base layer 150 and a second extrinsic base layer 160) and a semiconductor layer 110 comprising an entirely monocrystalline link-up region 115 (see portions 111 and 112) that electrically connects the intrinsic base layer 130 to the extrinsic base layers 150, 160.

Specifically, the bipolar device 100 can comprise a semiconductor substrate 101. The semiconductor substrate 101 can comprise a monocrystalline semiconductor material. For example, the semiconductor substrate 101 can comprise a bulk silicon substrate or any other suitable bulk monocrystalline semiconductor substrate, as illustrated in FIG. 1. Alternatively, the semiconductor substrate 101 can comprise a monocrystalline semiconductor layer of a semiconductor-on-insulator (SOI) wafer (e.g., a silicon layer of a silicon-on-insulator (SOI) wafer) (not shown). The semiconductor substrate 101 can have a first type conductivity (e.g., a P-type conductivity). Thus, for example, the semiconductor substrate 101 can comprise a P-silicon substrate (i.e., a silicon substrate having a relatively low concentration of a P-type dopant).

The bipolar device 100 can further comprise a trench isolation region 105 and a collector region 120. The trench isolation region 105 can comprise a shallow trench isolation (STI) region 105 within and at the top surface of the semiconductor substrate 101. The collector region 120 can also be within and at the top surface of the substrate 101 such that it is positioned laterally adjacent to the STI region 105. More specifically, the collector region 120 can comprise a doped region that is within the semiconductor substrate 101 and that has a second type conductivity that is different from the first type conductivity (e.g., an N-type conductivity). This collector region 120 can comprise a single N-well region. Alternatively, the collector region 120 can comprise multiple N-type collector components, having different doping concentrations and, thereby different conductivity levels. For example, the collector region 120 can comprise the following collector components described and illustrated in U.S. Patent Publication No. 2008/0265282 of Gluschenkov et al., published on Oct. 30, 2008, assigned to International Business Machines Corporation, and incorporated herein by reference: a N+ buried collector within the semiconductor substrate; a N− collector above the N+ buried collector and extending to the top surface of the semiconductor substrate; and an N+ selective implant collector (SIC) within the N− collector immediately adjacent to the N+ buried collector and separated from the top surface of the substrate by some distance. The STI region 105 can border (i.e., laterally surround) and, thereby define the dimensions (e.g., the length and the width) of the collector region 120. This STI region 105 can comprise, for example, a conventional STI region comprising a relatively shallow trench filled with one or more isolation materials (e.g., silicon oxide ($SiO_x$), silicon nitride ($SiN_x$), silicon oxynitride ($SiO_xN_y$) or any other suitable isolation material or combination thereof).

The bipolar device 100 can further comprise an intrinsic base layer 130 positioned on and, particularly, immediately adjacent to (i.e., in contact with) the top surface of the monocrystalline semiconductor substrate 101 at the collector region 120 and extending laterally onto the trench isolation region 105. The intrinsic base layer 130 may, optionally, have a relatively thin un-doped lower portion that it has neither N-type, nor P-type conductivity and further may have a relatively thin upper portion that is doped with a specific concentration of a first type conductivity dopant (e.g., a P-type dopant) such that it has the same type conductivity as the substrate 101 (e.g., P-type conductivity). This intrinsic base layer 130 can comprise an epitaxially deposited semiconductor. For example, in the case of a BJT, this intrinsic base layer 130 can comprise epitaxial silicon; whereas, in the case of an HBT, this intrinsic base layer 130 can comprise epitaxial silicon germanium, epitaxial silicon carbide, or epitaxial silicon germanium carbide. In any case, the intrinsic base layer 130 can be epitaxially grown (e.g., using a non-selective epitaxial deposition process) such that it has a monocrystalline section 131 above the collector region 120 and a polycrystalline section 132 above the trench isolation region 105. The monocrystalline section 131 can have a first center portion 135 and a first edge portion 133 positioned laterally between the first center portion 135 and the polycrystalline section 132. Those skilled in the art will recognize that, when a non-selective epitaxy process is used to form the intrinsic base layer 130, the resulting monocrystalline section 131 will typically grow faster and, thereby be thicker than the polycrystalline section 132.

At least one dielectric layer 140 can be positioned on and, particularly, immediately adjacent to the top surface of the polycrystalline section 132 of the intrinsic base layer 130. The dielectric layer 140 can comprise, for example, a silicon oxide ($SiO_x$) layer, a silicon nitride ($SiN_x$) layer, a silicon oxynitride ($SiO_xN_y$) layer or any other suitable dielectric layer or stack of such dielectric layers.

The semiconductor layer 110 can be positioned on the top surface of the first center portion 135 of the monocrystalline section 131 of the intrinsic base layer 130 and can further be physically separated from the dielectric layer 140 (see region 145 over the first edge portion 133 of the monocrystalline section 131 of the intrinsic base layer 130 between the dielectric layer 140 and semiconductor layer 110). The semiconductor layer 110 can further have a second center portion 113, a second edge portion 111 positioned laterally adjacent to the center portion 113 and a vertical extension 112 above and offset from the second edge portion 111 (e.g., positioned laterally between the second center portion 113 and the second edge portion 111 and extending upward). Each of these portions 111, 112 and 113 can be entirely monocrystalline in structure. The semiconductor layer 110 can comprise another epitaxially deposited semiconductor. For example, in the case of either a BJT or HBT, this semiconductor layer 110 can comprise epitaxial silicon, silicon germanium, silicon carbide or silicon germanium carbide. This semiconductor layer 110 may be un-doped such that it has neither N-type, nor P-type conductivity. Alternatively, it may be doped with a first type conductivity dopant (e.g., a P-type dopant) such that it has the same type conductivity as the substrate 101 (e.g., P-type conductivity) and, if applicable, the intrinsic base layer 130.

As mentioned above, the multiple extrinsic base layers can comprise a first extrinsic base layer 150 and a second extrinsic base layer 160.

The first extrinsic base layer 150 can be positioned on the dielectric layer 140 (i.e., over the polycrystalline section 132 of the intrinsic base layer 130) and can extend laterally onto and, particularly, immediately adjacent to (i.e., in contact with) the top surface of the first edge portion 133 of the monocrystalline section 131 of the intrinsic base layer 130 within the region 145. This first extrinsic base layer 150 can further extend laterally onto the top surface of the second edge portion 111 of the semiconductor layer 110 so that it abuts the vertical extension 112. This first extrinsic base layer 150 can comprise a semiconductor. For example, in the case of either a BJT or HBT, this first extrinsic base layer 150 can comprise silicon, silicon germanium, silicon carbide or silicon germanium carbide. In any case, this first extrinsic base layer 150 can be monocrystalline in structure. Additionally, this first extrinsic base layer 150 may be un-doped such that it has neither N-type, nor P-type conductivity. Alternatively, it may be doped with a first type conductivity dopant (e.g., a P-type dopant) such that it has the same type conductivity as the substrate 101 (e.g., P-type conductivity) and, if applicable, the same conductivity type as the intrinsic base layer 130.

The second extrinsic base layer 160 can be positioned on and, particularly, immediately adjacent to (i.e., in contact with) the first extrinsic base layer 150. The second extrinsic base layer 160 can have the first type conductivity (e.g., P-type conductivity). Furthermore, the concentration of first type conductivity dopant (e.g., P-type dopant) in the extrinsic base layer 160 can, optionally, be relatively high as compared to the concentration of the same type conductivity dopant in any one or more of the first extrinsic base layer 150, the intrinsic base layer 130, the semiconductor layer 110 and/or the semiconductor substrate 101. This second extrinsic base layer 160 can be in situ doped with first type conductivity dopant during epitaxial growth or can be implanted with the first type conductivity dopant or both. This second extrinsic base layer 160 can comprise yet another deposited semiconductor. For example, in the case of either a BJT or HBT, this second extrinsic base layer 160 can comprise epitaxial silicon, silicon germanium, silicon carbide, silicon germanium carbide or a combination of these materials Like the first extrinsic base layer 150, the second extrinsic base layer 160 can abut the vertical extension 112 of the semiconductor layer 110. Thus, the first extrinsic base layer 150 and the second extrinsic base layer 160 can have vertically aligned sidewalls 153, 163, respectively, immediately adjacent to (i.e., abutting) a vertical sidewall of the vertical extension 112 of semiconductor layer 110.

It should be noted that, during processing as discussed in greater detail below with regard to the method embodiments, the first extrinsic base layer 150 is initially deposited such that it is amorphous or polycrystalline in structure and an anneal process is subsequently performed (e.g., either before or after epitaxial deposition of the second extrinsic base layer) so that it becomes monocrystalline (i.e., to crystallize it using the edge portion 133 of the monocrystalline section 131 of the intrinsic base layer 130 as the seed layer). During anneal, polycrystalline or amorphous semiconductor material in region 145 recrystallizes and acquires the crystal structure and orientation of the single crystal semiconductor material of first edge portion 133. Ideally, as a result of epitaxial deposition of the second extrinsic base layer onto the first extrinsic base layer or as a result of an anneal process following epitaxial deposition of the second extrinsic base layer, the entire first and second extrinsic base layers will be monocrystalline in structure. However, since crystallization of an initially amorphous or polycrystalline first extrinsic base layer 150 progresses from the interface with the first edge portion 133 of monocrystalline section 131 of the intrinsic base layer 130 outward to an end point as a function of the time and temperature of the anneal and since the end point of crystallization in the first extrinsic base layer 150 and, thereby the end point of crystallization in the second extrinsic base layer 160 may vary as a function of other environmental conditions, the resulting structure may vary across chip and from chip to chip. Consequently, during processing as discussed in greater detail below with regard to the method embodiments, the first extrinsic base layer 150 alone or both the first extrinsic base layer 150 and the second extrinsic base layer 160 can be patterned so that the entire first extrinsic base layer 150 is assured to be monocrystalline in structure given the specifications of the anneal process used and so that the second extrinsic base layer 160 or section thereof on the top surface of the first extrinsic base layer 150 is also assured to be monocrystalline in structure in order to minimize across chip as well as chip to chip variations. Thus, depending upon the embodiment, the extrinsic base layer 160 can comprise an entirely monocrystalline semiconductor extrinsic base layer 160 or, alternatively, at least the section of the extrinsic base layer 160 that extends laterally over the edge portion 111 of the semiconductor layer 110 to the vertical extension 112 thereof can be monocrystalline in structure.

Figure 2:
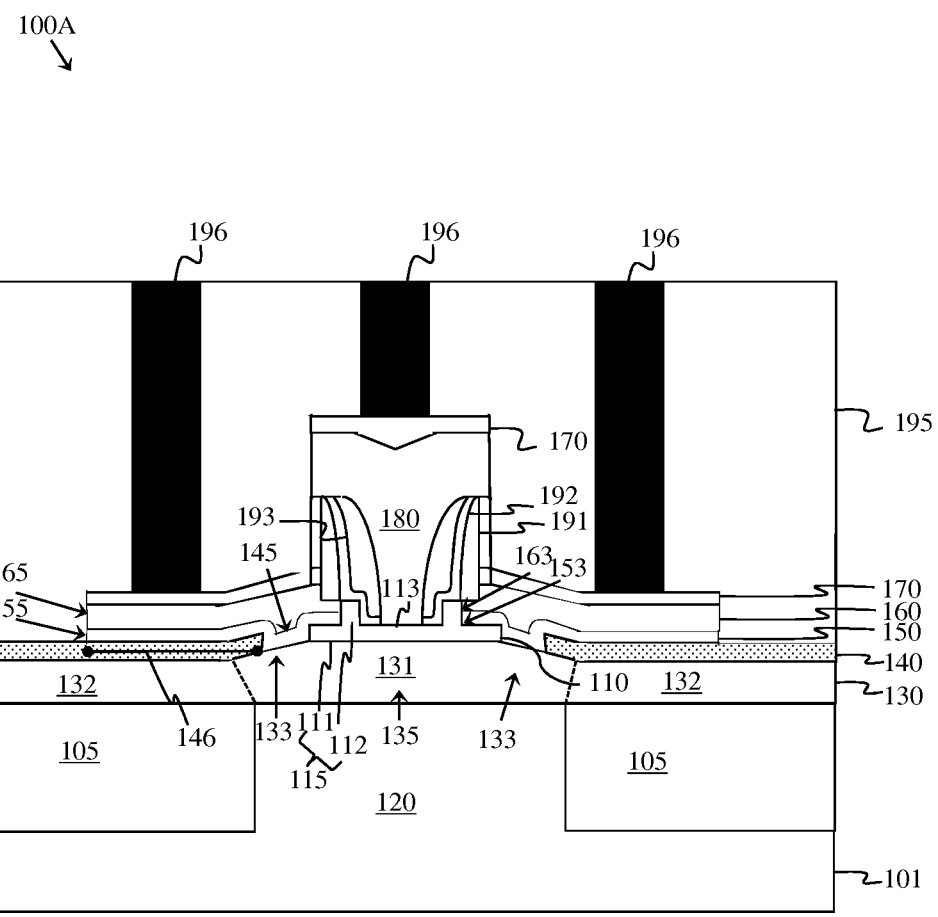
FIG. 2 is a cross-section diagram illustrating another embodiment of a bipolar device.

Specifically, referring to FIG. 2, in one particular embodiment, the first extrinsic base layer 150 and the second extrinsic base layer 160 of a bipolar device 100A can have vertically aligned sidewalls 153, 163 adjacent to the vertical extension 112 of the semiconductor layer 110, as discussed above, and can further be patterned (e.g., lithographically) during processing so as to have additional vertically aligned sidewalls 155, 165, respectively, above the dielectric layer 140 (i.e., over the polycrystalline section 132 of the intrinsic base layer 130). The additional vertically aligned sidewalls 155, 165 can be some predetermined distance 146 from the region 145 (i.e., from where the first extrinsic base layer 150 contacts the first edge portion 133 of the monocrystalline section 131 of the intrinsic base layer 130 between the dielectric layer 140 and the link up layer 110) so as to ensure that the remaining portion of the first extrinsic base layer 150 will be entirely monocrystalline in structure following an anneal performed during processing. In this case, the second extrinsic base layer 160, which is aligned above the first extrinsic base layer 150, will also be entirely monocrystalline in structure.

Figure 3:
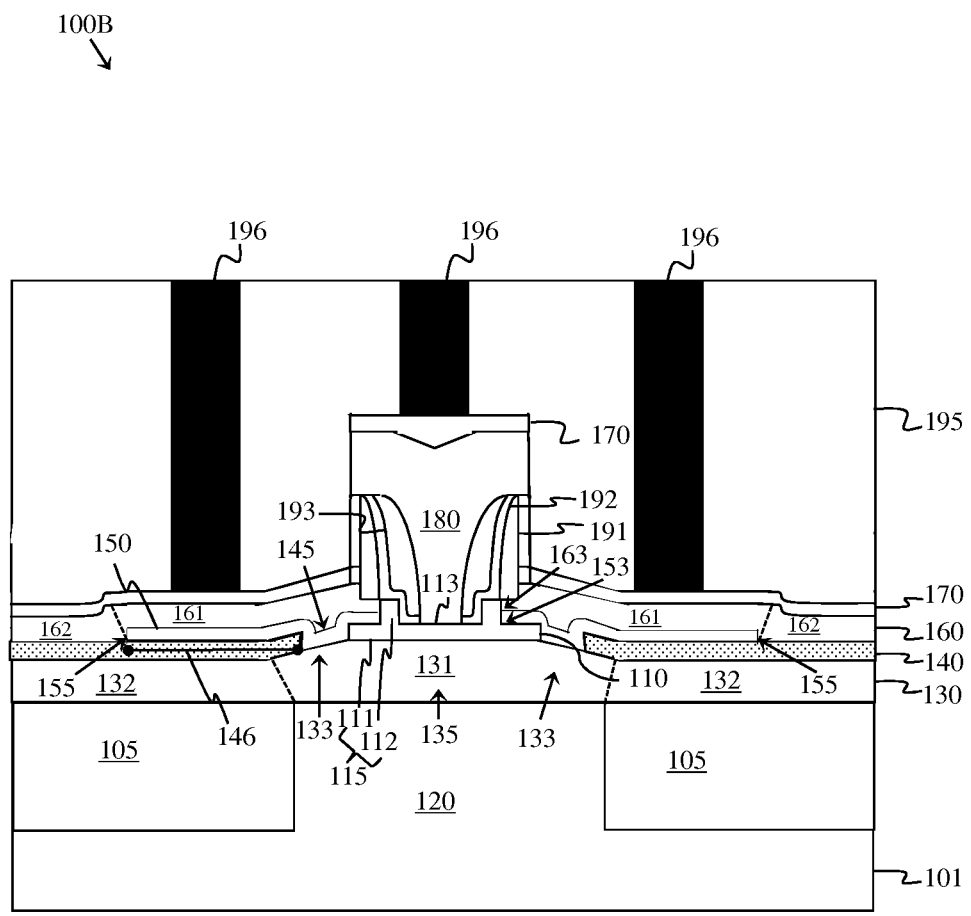
FIG. 3 is a cross-section diagram illustrating yet another embodiment of a bipolar device.

Alternatively, referring to FIG. 3, in another particular embodiment, the first extrinsic base layer 150 and the second extrinsic base layer 160 of a bipolar device 100B can have vertically aligned sidewalls 153, 163 adjacent to the vertical extension 112 of the semiconductor layer 110, as discussed above, and the first extrinsic base layer 150 alone can be patterned (e.g., lithographically) during processing so as to have an additional vertical sidewall 155 above the dielectric layer 140 (i.e., over the polycrystalline section 131 of the intrinsic base layer 130). The additional vertical sidewall 155 can be some predetermined distance 146 from the region 145 (i.e., from where the first extrinsic base layer 150 contacts the first edge portion 133 of the monocrystalline section 131 of the intrinsic base layer 130 between the dielectric layer 140 and the link up layer 110) so as to ensure that the remaining portion of the first extrinsic base layer 150 will be entirely monocrystalline in structure following an anneal performed during processing. In this case, the second extrinsic base layer 160 can be positioned on the first extrinsic base layer 150 and can further extend laterally beyond the sidewall 155 and onto the top surface of the dielectric layer 140. Thus, in the resulting structure, the second extrinsic base layer 160 can comprise an additional monocrystalline section 161, which is aligned above the first extrinsic base layer 150, and an additional polycrystalline section 162, which is aligned above the dielectric layer 140 and positioned laterally adjacent to the additional monocrystalline section 161.

Regardless of whether the second extrinsic base layer 160 is entirely monocrystalline in structure (e.g., as in FIG. 2) or comprises only a monocrystalline section 161 adjacent to the vertical extension 112 of the semiconductor layer 110 (as in FIG. 3), the semiconductor layer 110 itself is epitaxially grown, during processing as described in detail below with regard to the method embodiments, on only monocrystalline surfaces of the first extrinsic base layer, second extrinsic base layer and intrinsic base layer and, thereby will comprise only monocrystalline semiconductor material. That is, the second edge portion 111, vertical extension 112 and center portion 113 of the semiconductor layer 110 will each be entirely monocrystalline in structure and, particularly, the second edge portion 111 and vertical extension 112 of the semiconductor layer 110 will form an entirely monocrystalline link-up region between the intrinsic base layer 130 and the multiple extrinsic base layers 150, 160. In such a bipolar device structure, the interface between the semiconductor layer 110 and the intrinsic base 130 and the interfaces between the semiconductor layer 110 and the extrinsic bases 150, 160 are all monocrystalline semiconductor material to monocrystalline semiconductor material interfaces. Since the entire link-up region 115 (i.e., portions 111 and 112 of the semiconductor layer 110) is monocrystalline semiconductor material and since the interfaces between the semiconductor layer and the bases are monocrystalline semiconductor material to monocrystalline semiconductor material interfaces overall base resistance $R_b$ is minimized for a higher $f_{max}$.

As with conventional bipolar junction transistors (BJTs) and conventional heterojunction bipolar transistors (HBTs), the bipolar devices disclosed herein and illustrated in FIGS. 1-3 can further comprise additional features including, but not limited to, an emitter layer 180, dielectric spacers 191-193, metal silicide layer(s) 170, interlayer dielectrics 195, contacts 196, etc. Various different configurations for these additional features are well known in the art and can be incorporated into different embodiments of the bipolar device.

For example, as shown in FIGS. 1, 2 and 3, the emitter layer 180 (e.g., an essentially T-shaped emitter layer) can be positioned above the second center portion 113 of the semiconductor layer 110, which in turn is aligned above the first center portion 135 of the monocrystalline section 131 of the intrinsic base layer 130. Specifically, the essentially T-shaped emitter layer 180 can have a relatively narrow section that extends vertically through an emitter opening in the first extrinsic base layer 150 and second extrinsic base layer 160 to the second center portion 113 of the semiconductor layer 110 and a relatively wide section above the narrow section. The emitter layer 180 can comprise, for example, a polycrystalline semiconductor layer (e.g., a polycrystalline silicon layer) having the same second type conductivity as the collector region 120 (e.g., N-type conductivity). At least one dielectric spacer (e.g., see dielectric spacers 191-193) can electrically isolate the narrow section of the emitter layer 180 from the extrinsic base layers 150, 160. For example, the emitter opening can have an upper portion that extends vertically into, but not through, the second extrinsic base layer 160. A first dielectric spacer 191 (e.g., a silicon nitride ($SiN_x$) spacer) can be positioned laterally adjacent to the sidewall of this upper portion of the emitter opening. A second dielectric spacer 192 (e.g., a conformal silicon oxide ($SiO_x$) spacer) can be positioned laterally adjacent to the first dielectric spacer 191 and can further cover the top surface of the semiconductor layer vertical extension 112 as well as the sidewall of the semiconductor layer vertical extension 112 opposite the vertically aligned sidewalls 153, 163 of the first extrinsic base layer 150 and second extrinsic base layer 160. Finally, a third dielectric spacer 193 (e.g., another silicon nitride ($SiN_x$) spacer) can be positioned laterally between the second dielectric spacer 192 and the narrow portion of the emitter layer 180.

Metal silicide layer(s) 170 can, optionally, be positioned on the top surface of the second extrinsic base layer 160 and the top surface of the emitter layer 180. Such metal silicide layers 170 can comprise silicides of, for example, a refractory or noble metal (e.g., nickel (Ni), cobalt (Co), tungsten (W), chromium (Cr), platinum (Pt), titanium (Ti), molybdenum (Mo), palladium (Pd), etc.) or an alloy thereof. It should be noted that, if applicable, the dielectric spacer(s) 191-193 can also isolate the lower portion of the emitter layer 180 from any metal silicide layer 170 on the second extrinsic base layer 160.

One or more additional dielectric layer(s) 195 can blanket (i.e., cover) the bipolar device, as described above. These additional dielectric layer(s) can comprise, for example, any suitable interlayer dielectric material(s). For example, the additional dielectric layer(s) 195 can comprise any of silicon oxide ($SiO_x$), silicon nitride ($SiN_x$), borophosphosilicate glass (BPSG), etc. Finally, contacts 196 can extend vertically through the dielectric layer(s) 195 in order to contact the second extrinsic base layer 160, the emitter layer 180, etc.

Figure 4:
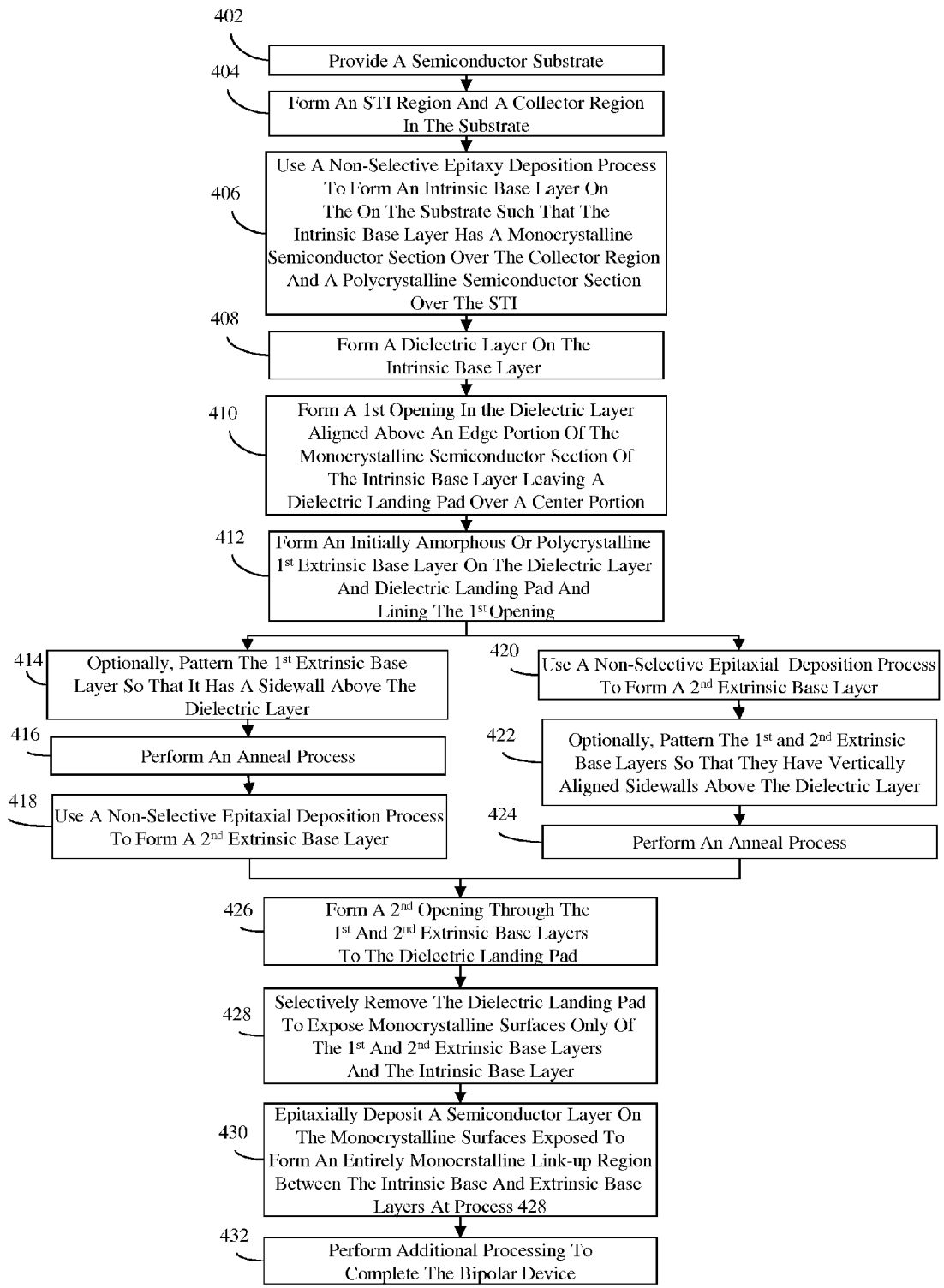
FIG. 4 is a flow diagram illustrating method embodiments for forming the bipolar devices of FIGS. 1-3.

Referring to FIG. 4, also disclosed herein are embodiments of a method of forming the above-described bipolar device embodiments. The method embodiments can comprise providing a monocrystalline semiconductor substrate 101 (402) and forming, in the substrate 101, a collector region 120 and a trench isolation region 105 positioned laterally adjacent to the collector region 120 (404, see FIG. 5).

More particularly, the method embodiments can comprise providing a semiconductor substrate 101 (402). This semiconductor substrate 101 can comprise a monocrystalline semiconductor material. For example, the semiconductor substrate 101 can comprise a bulk silicon substrate or any other suitable bulk semiconductor substrate, as illustrated in FIG. 3. Alternatively, the semiconductor substrate 101 can comprise a monocrystalline semiconductor layer of a semiconductor-on-insulator (SOI) wafer (e.g., a silicon layer of a silicon-on-insulator (SOI) wafer) (not shown). In any case, the semiconductor substrate 101 can have a first type conductivity (e.g., a P-type conductivity). Thus, for example, the semiconductor substrate 101 can comprise a P-silicon substrate (i.e., a silicon substrate having a relatively low concentration of a P-type dopant).

Figure 5:
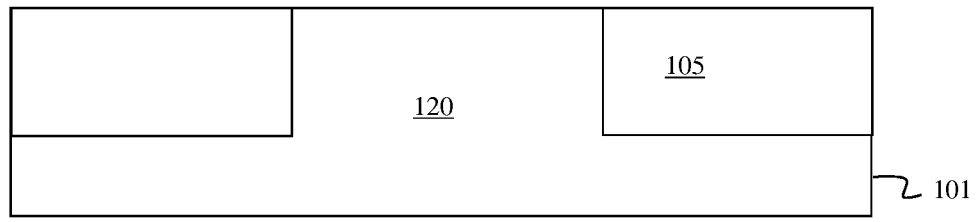
FIG. 5 is a cross-section diagram illustrating a partially completed bipolar device formed according to the flow diagram of FIG. 4.

A shallow trench isolation (STI) region 105 can be formed within and at the top surface of the semiconductor substrate 101 so as to define the active area of the bipolar device (404, see FIG. 5). The STI region 105 can be formed using conventional shallow trench isolation (STI) formation techniques. For example, a trench can be lithographically patterned and etched into the semiconductor substrate 101 so as to define the active region. The trench can then be filled with one or more isolation materials (e.g., silicon oxide ($SiO_x$), silicon nitride ($SiN_x$), silicon oxynitride ($SiO_xN_y$) or any other suitable isolation materials). Additionally, a collector region 120 can be formed within the active area of the semiconductor substrate 101, as defined by the STI region 105 (404, see FIG. 5). Thus, the STI region 105 defines the dimensions (e.g., the length and width) of the collector region 120. This collector region 120 can be formed (e.g., implanted with a dopant) so as to have a second type conductivity that is different from the first type conductivity of the substrate (e.g., an N-type conductivity). Various different techniques for forming BJT and HBT collector regions having different configurations are well known in the art and can be incorporated into the method embodiments disclosed herein. For example, the collector region 120 can be formed as a single N-well region within the substrate 101. Alternatively, the collector region 120 can be formed as multiple N-type collector components, such as the following components described and illustrated in U.S. Patent Publication No. 2008/0265282 of Gluschenkov et al., published on Oct. 30, 2008, assigned to International Business Machines Corporation, and incorporated herein by reference: an N+ buried collector within the substrate; a N− collector above the N+ buried collector and extending to the top surface of the substrate; and an N+ selective implant collector (SIC) within the N-collector immediately adjacent to the N+ buried collector and separated from the top surface of the substrate by some distance.

Figure 6:
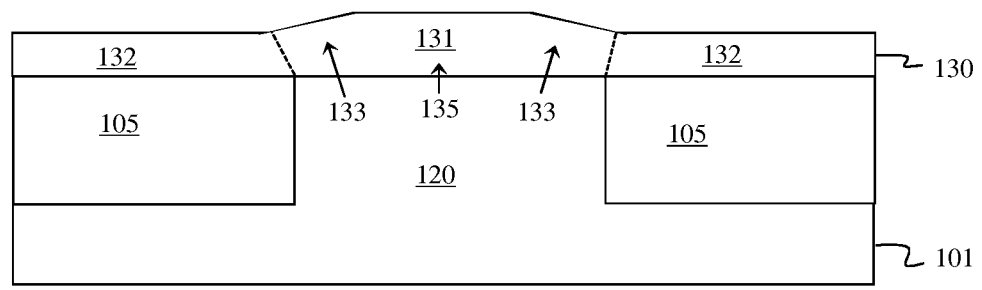
FIG. 6 is a cross-section diagram illustrating a partially completed bipolar device formed according to the flow diagram of FIG. 4.

Next, the method embodiments can comprise epitaxially depositing an intrinsic base layer 130 onto the top surface of the monocrystalline semiconductor substrate 101 such that the intrinsic base layer 130 comprises: a monocrystalline section 131 over the collector region 120 in the substrate 101; and a polycrystalline section 132 positioned laterally adjacent to the monocrystalline section 131 and over the trench isolation region 105 in the substrate 101 (406, see FIG. 6). The monocrystalline section 131 of the intrinsic base layer 130 can further have a first center portion 135 and a first edge portion 133 positioned laterally between the first center portion 135 and the polycrystalline section 132.

More specifically, in the case of a BJT, the intrinsic base layer 130 formed at process 406 can comprise, for example, silicon. In the case of an HBT, the intrinsic base layer 130 formed at process 406 can comprise, for example, silicon, silicon germanium, silicon carbide, silicon germanium carbide or a combination of two or more of these materials. In any case, this intrinsic base layer 130 can be formed, for example, by performing a non-selective epitaxy process (e.g., a non-selective, ultra high-vacuum-chemical vapor deposition (UHV-CVD), low-temperature epitaxy (LTE) process). Those skilled in the art will recognize that, as a result of such a non-selective epitaxy process, the crystalline structure of the intrinsic base layer 130 will typically mimic that of the substrate 101 below. Thus, the intrinsic base layer 130 will be formed such that it comprises a monocrystalline section 131 and a polycrystalline section 132. The monocrystalline section 131 will be aligned above and approximately equal in size to the collector region 120. The polycrystalline section 132 will be aligned above the trench isolation region 105 and positioned laterally adjacent to the monocrystalline section 131. Furthermore, the polycrystalline section 132 will typically be less thick than the monocrystalline section 131, as a result of the faster epitaxial growth rate of monocrystalline semiconductor material as compared to polycrystalline semiconductor material. Finally, deposition of the intrinsic base layer 130 may proceed without any doping to alter conductivity type. Alternatively, the intrinsic base layer 130 may be uniformly in-situ doped with a first conductivity type dopant (e.g., a P-type dopant) so that the resulting intrinsic base layer 130 has the first type conductivity (e.g., P-type conductivity). Alternatively, deposition of the intrinsic base layer 130 may begin without doping such that the resulting intrinsic base layer 130 has a relatively thin un-doped lower portion. Subsequently, in-situ doping with a first conductivity type dopant (e.g., a P-type dopant) can be performed so that the resulting intrinsic base layer has a, relatively thin, doped upper portion with the first type conductivity (e.g., P-type conductivity).

Figure 7:
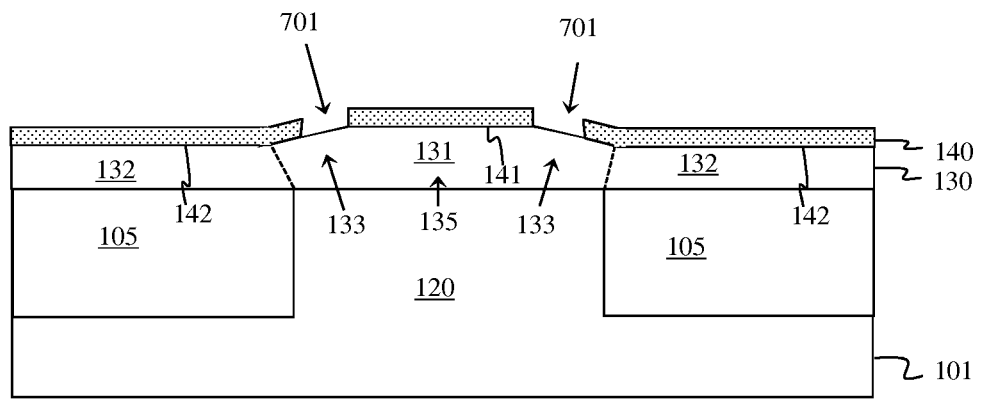
FIG. 7 is a cross-section diagram illustrating a partially completed bipolar device formed according to the flow diagram of FIG. 4.

After the intrinsic base layer is deposited at process 406, a dielectric layer 140 can be formed (e.g., deposited) on the intrinsic base layer 130 (408). This dielectric layer 140 can comprise, for example, a silicon oxide ($SiO_x$) layer, a silicon nitride ($SiN_s$) layer, a silicon oxynitride ($SiO_xN_y$) layer or any other suitable dielectric layer or stack of such dielectric layers. Next, a first opening 701 can be formed in the dielectric layer 140 (410, see FIG. 7). Specifically, the first opening 701 can be formed (e.g., lithographically patterned and etched) in the dielectric layer 140 such that it is aligned above and exposes the top surface of the first edge portion 133 only of the monocrystalline section 131 of the intrinsic base layer 130, thereby leaving a dielectric landing pad 141 aligned above the first center portion 135 of the monocrystalline section 131 and the remaining portion 142 of the dielectric layer 140 on the polycrystalline section 132 of the intrinsic base layer 130.

Figure 8:
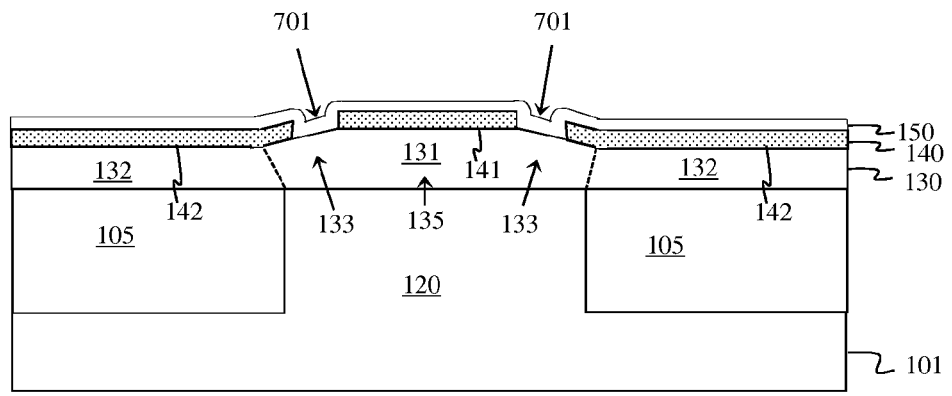
FIG. 8 is a cross-section diagram illustrating a partially completed bipolar device formed according to the flow diagram of FIG. 4.

Next, a relatively thin first extrinsic base layer 150 can be formed on the dielectric layer 140 such that the first extrinsic base layer 150 lines the first opening 701 and extends laterally onto the top surface of the dielectric landing pad 141 (412, see FIG. 8). Specifically, this first extrinsic base layer 150 can be deposited so as to have a maximum thickness of less than 200 nm and so as to be either amorphous or polycrystalline in structure. The first extrinsic base layer 150 can comprise a semiconductor. For example, in the case of either a BJT or an HBT, the first extrinsic base layer 150 can comprise silicon, silicon germanium, silicon carbide, silicon germanium carbide or a combination of two or more of these materials. Additionally, this first extrinsic base layer 150 may be un-doped such that it has neither N-type, nor P-type conductivity. Alternatively, it may be in-situ doped or subsequently implanted with a first type conductivity dopant (e.g., a P-type dopant) such that it has the same type conductivity as the substrate 101 (e.g., P-type conductivity) and, if applicable, the same conductivity type as the intrinsic base layer 130. Those skilled in the art will recognize that different chemical vapor deposition (CVD) processes may be used to form such an amorphous or polycrystalline extrinsic base layer (e.g., rapid thermal chemical vapor deposition (RTCVD), low pressure chemical vapor deposition (LPCVD) or plasma enhanced chemical vapor deposition (PECVD)).

Figure 9:
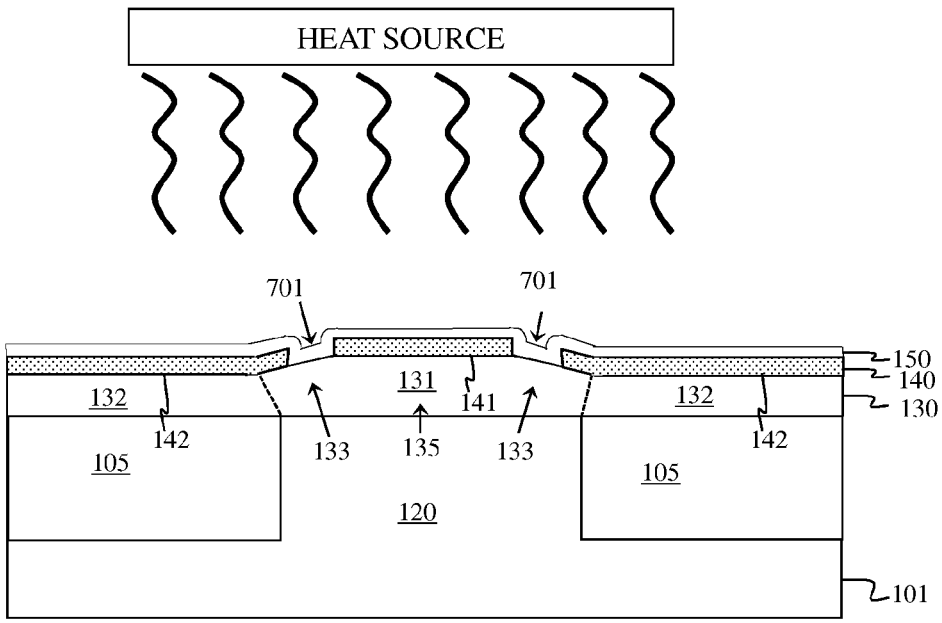
FIG. 9 is a cross-section diagram illustrating a partially completed bipolar device formed according to the flow diagram of FIG. 4.

In one particular embodiment, after the first extrinsic base layer 150 is formed at process 412, a solid phase epitaxy regrowth process and, particularly, an anneal process can be performed so as to crystallize the initially amorphous or polycrystalline semiconductor material of the first extrinsic base layer 150 so that it becomes monocrystalline in structure (416, see FIG. 9). It should be noted that, since the first extrinsic base layer 150 is immediately adjacent to the first edge portion 133 of the monocrystalline section 131 of the intrinsic base layer 130 within the first opening 701, that first edge portion 133 will function as a seed layer during this solid phase epitaxy regrowth process such that the first extrinsic base layer 150 will acquire the crystal structure and orientation of the single crystal semiconductor material of the edge portion 133 of the intrinsic base layer 130.

Figure 10:
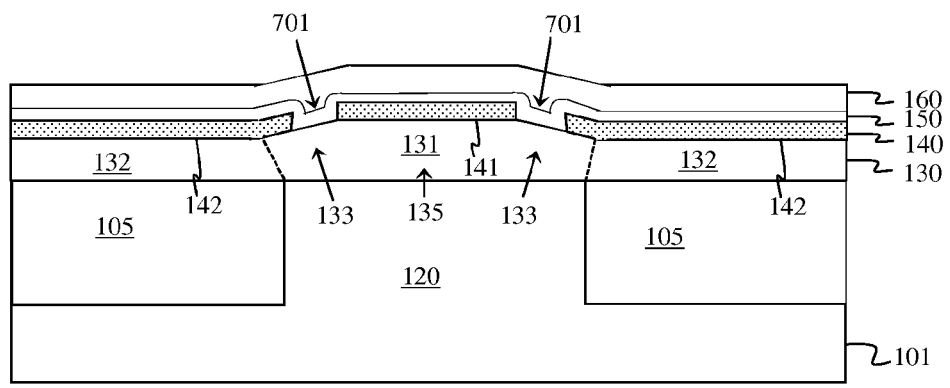
FIG. 10 is a cross-section diagram illustrating a partially completed bipolar device formed according to the flow diagram of FIG. 4.

Then, a second extrinsic base layer 160 can be deposited (e.g., using a non-selective epitaxial deposition process) on the first extrinsic base layer 150 (418, see FIG. 10).

The second extrinsic base layer 160 can comprise a semiconductor. For example, in the case of either a BJT or an HBT, the second extrinsic base layer 160 can comprise epitaxial silicon, silicon germanium, silicon carbide, silicon germanium carbide or a combination of two more of these materials. The second extrinsic base layer 160 can further be in-situ doped or subsequently implanted so as to have the first type conductivity (e.g., P-type conductivity). Furthermore, the concentration of first type conductivity dopant (e.g., P-type dopant) in the second extrinsic base layer 160 can, optionally, be relatively high as compared to the concentration of the same type conductivity dopant in any one or more of the first extrinsic base layer 150, the intrinsic base layer 130, and/or the semiconductor substrate 101.

Figure 11:
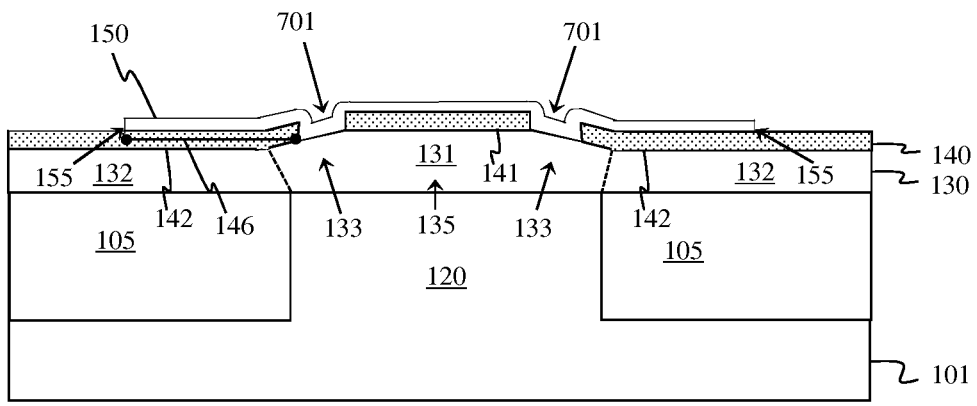
FIG. 11 is a cross-section diagram illustrating a partially completed bipolar device, as shown in FIG. 3 specifically, formed according to the flow diagram of FIG. 4.
Figure 12:
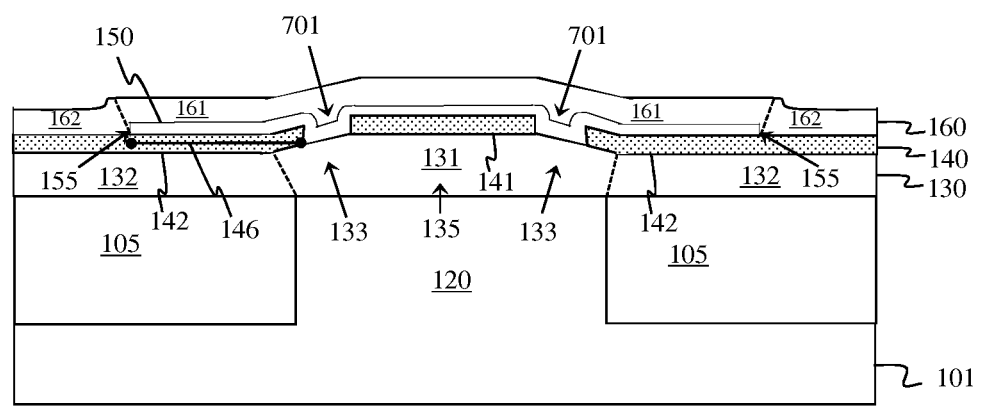
FIG. 12 is a cross-section diagram illustrating a partially completed bipolar device, as shown in FIG. 3 specifically, formed according to the flow diagram of FIG. 4.

It should be noted that, ideally, as a result of the anneal process 416, the first extrinsic layer 150 will be entirely monocrystalline in structure and, thus, the epitaxially deposited second extrinsic base layer 160 will also be entirely monocrystalline in structure since its crystalline structure will mimic that of the first extrinsic base layer 150 below. However, because crystallization of the initially amorphous or polycrystalline first extrinsic base layer 150 progresses from the opening 701 in the dielectric layer 140 (i.e., from the interface between the first edge portion 133 of the monocrystalline section 131 of the intrinsic base layer 130 and the first extrinsic base layer 150) outward and stops at some end point as a function of the time and temperature of the anneal, the first extrinsic base layer 150 as well as the subsequently deposited second extrinsic base layer 160 may each have monocrystalline inner sections and amorphous or polycrystalline outer sections. Furthermore, the locations of the interfaces between the inner and outer sections may vary across chip and from chip to chip due to varying environmental conditions. Therefore, to avoid across chip and/or chip to chip variations in such bipolar devices, the first extrinsic base layer 150 can optionally be patterned (e.g., lithographically) before the second extrinsic base layer 160 is deposited at process 418 (e.g., before or after the anneal at process 416 to crystallize the first extrinsic base layer 150) (414, see FIG. 11). In this case, the first extrinsic base layer 150 will have a vertical sidewall 155 above the dielectric layer 140 and, particularly, above the remaining portion 142 of the dielectric layer 140 over the polycrystalline section 132 of the intrinsic base layer 130. This vertical sidewall 155 can be some predetermined distance 146 from the opening 701 so that the remaining portion of first extrinsic base layer 150 is assured to be entirely monocrystalline in structure given the specifications of the anneal process used. In this case, epitaxial deposition of the second extrinsic base layer 160 at process 418 will result in the second extrinsic base layer 160 comprising an additional monocrystalline section 161 aligned above the first extrinsic base layer 150 and an additional polycrystalline section 162 positioned laterally adjacent to the additional monocrystalline section 161 and on the portion 142 of the dielectric layer 140 beyond the sidewall 155 (see FIG. 12).

Figure 13:
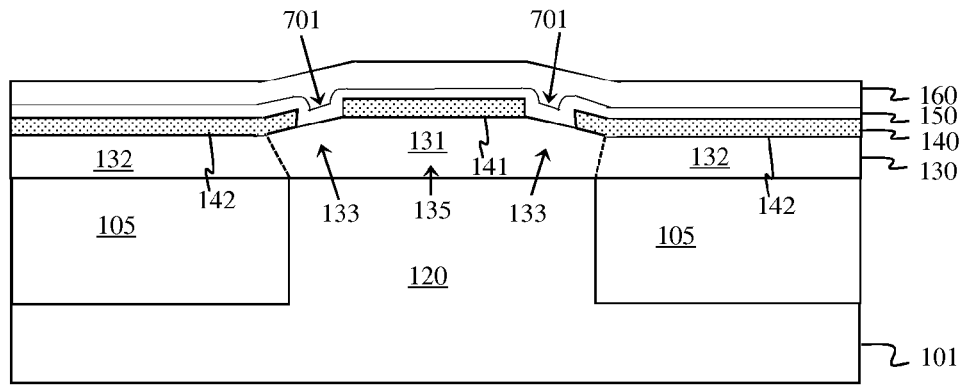
FIG. 13 is a cross-section diagram illustrating a partially completed bipolar device, as shown in FIG. 2 specifically, formed according to the flow diagram of FIG. 4.
Figure 14:
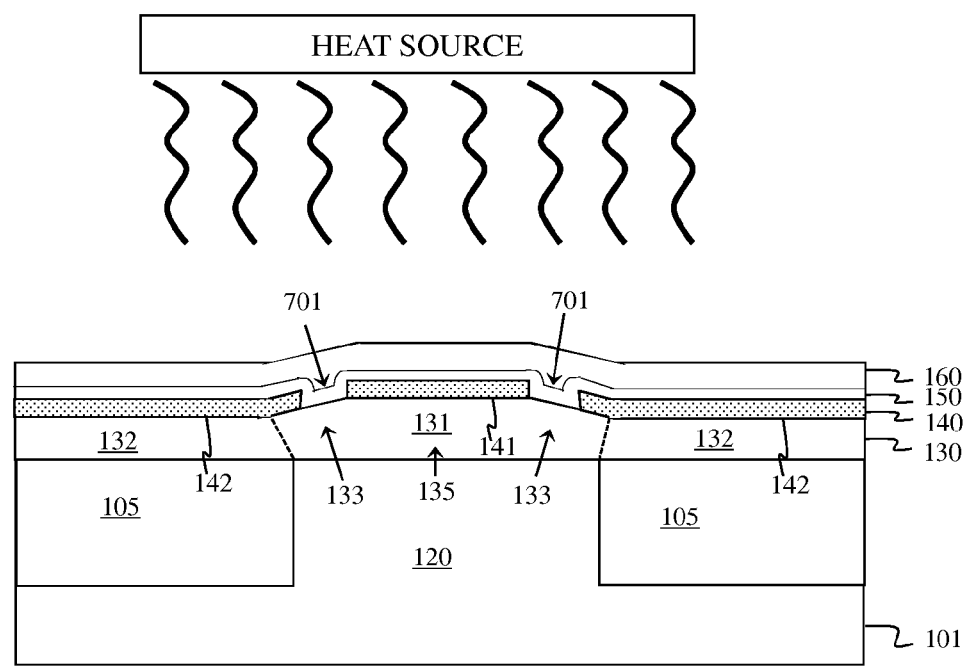
FIG. 14 is a cross-section diagram illustrating a partially completed bipolar device, as shown in FIG. 2 specifically, formed according to the flow diagram of FIG. 4.

Alternatively, in another particular embodiment, after the first extrinsic base layer 150 is formed on the dielectric layer 140 and, particularly, before any anneal process is performed, a second extrinsic base layer 160 can be deposited (e.g., using a non-selective epitaxial deposition process) on the first extrinsic base layer 150 (420, see FIG. 13). As in the previously described embodiment, the second extrinsic base layer 160 can comprise a semiconductor. For example, in the case of either a BJT or an HBT, the second extrinsic base layer 160 can comprise epitaxial silicon, silicon germanium, silicon carbide or silicon germanium carbide. Additionally, the second extrinsic base layer 160 can be in-situ doped or subsequently implanted so as to have the first type conductivity (e.g., P-type conductivity). Furthermore, the concentration of first type conductivity dopant (e.g., P-type dopant) in the second extrinsic base layer 160 can, optionally, be relatively high as compared to the concentration of the same type conductivity dopant in any one or more of the first extrinsic base layer 150, the intrinsic base layer 130, and/or the semiconductor substrate 101. In this case, since the first extrinsic base layer 150 is still amorphous or polycrystalline in structure when the second extrinsic base layer 160 is deposited at process 420, the second extrinsic base layer 160 will also be amorphous or polycrystalline in structure. Then, after the second extrinsic base layer 160 is deposited at process 420, a solid phase epitaxy regrowth process and, particularly, an anneal process can be performed so that the amorphous or polycrystalline semiconductor material of the first extrinsic base layer 150 becomes monocrystalline in structure (i.e., to crystallize the first extrinsic base layer 150) (424, see FIG. 14). Again, it should be noted that, since the first extrinsic base layer 150 is immediately adjacent to the first edge portion 133 of the monocrystalline section 131 of the intrinsic base layer 130 within the first opening 701, the first edge portion 133 will function as a seed layer during this solid phase epitaxy regrowth process. This anneal process 424 can also be used to essentially simultaneously crystallize the amorphous or polycrystalline semiconductor material of the second extrinsic base layer 160 so it too becomes monocrystalline in structure.

Figure 15:
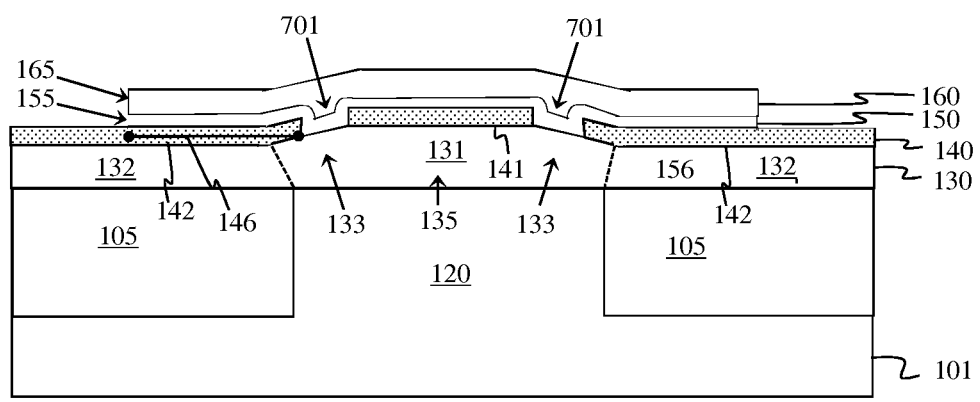
FIG. 15 is a cross-section diagram illustrating a partially completed bipolar device, as shown in FIG. 2 specifically, formed according to the flow diagram of FIG. 4.

As in the previously described embodiment, it should be noted that, ideally, as a result of the anneal process 424, the first extrinsic base layer 150 will be an entirely monocrystalline semiconductor first extrinsic base layer and, thus, the second extrinsic base layer 160 will also be an entirely monocrystalline semiconductor second extrinsic base layer because its crystalline structure will mimic that of the first extrinsic base layer due to the epitaxial deposition process. However, because crystallization of the initially amorphous or polycrystalline first extrinsic base layer 150 progresses from the opening 701 in the dielectric layer 140 (i.e., from the interface between the first edge portion 133 of the monocrystalline section 131 of the intrinsic base layer 130 and first extrinsic base layer 150) outward and stops at some end point as a function of the time and temperature of the anneal, the first extrinsic base layer 150 as well as the subsequently deposited second extrinsic base layer 160 may each have monocrystalline inner sections and amorphous or polycrystalline outer sections. Furthermore, the locations of the interfaces between the inner and outer sections may vary across chip and from chip to chip due to varying environmental conditions. Therefore, to avoid across chip and/or chip to chip variations in such bipolar devices, after depositing the second extrinsic base layer 160 at process 420 (e.g., before or after the anneal at process 424), the first extrinsic base layer 150 and second extrinsic base layer 160 can be patterned (e.g., lithographically) so as to have vertically aligned sidewalls 155 and 165, respectively, above the portion 142 of the dielectric layer 140 (422, see FIG. 15). These vertically aligned sidewalls 155 and 165 can be some predetermined distance 146 from the opening so that the remaining portions of the first extrinsic base layer 150 and second extrinsic base layer 160 are assured to be entirely monocrystalline in structure given the specifications of the anneal process used.

It should be noted that in the embodiments described above, the anneal process 416 or 424 used to crystallize the amorphous or polycrystalline semiconductor material of the first extrinsic base layer 150 (and, if applicable, the second extrinsic base layer 160) can comprise, for example, a low temperature thermal anneal process (e.g., a thermal anneal between 400 and 850° C. performed over a period of 1 minute to 8 hours). Alternatively, the anneal process 416 or 424 can comprise a laser anneal process or a flash anneal process.

After the processes 414-418 or the processes 420-424 are performed as described above, additional process steps can be performed in order to form a semiconductor layer 110 comprising an entirely monocrystalline link-up region 115 (see monocrystalline portions 111 and 112) that electrically connects the intrinsic base layer 130 and the extrinsic base layers 150, 160 (426)-(430) and to complete the bipolar device structure (432). For illustration purposes, the additional processes (426)-(432) will be described and illustrated with respect to the embodiment shown in FIG. 1; however, those skilled in the art will recognize that these same processes may be performed with respect to the embodiments shown in FIG. 2 and FIG. 3.

Figure 16:
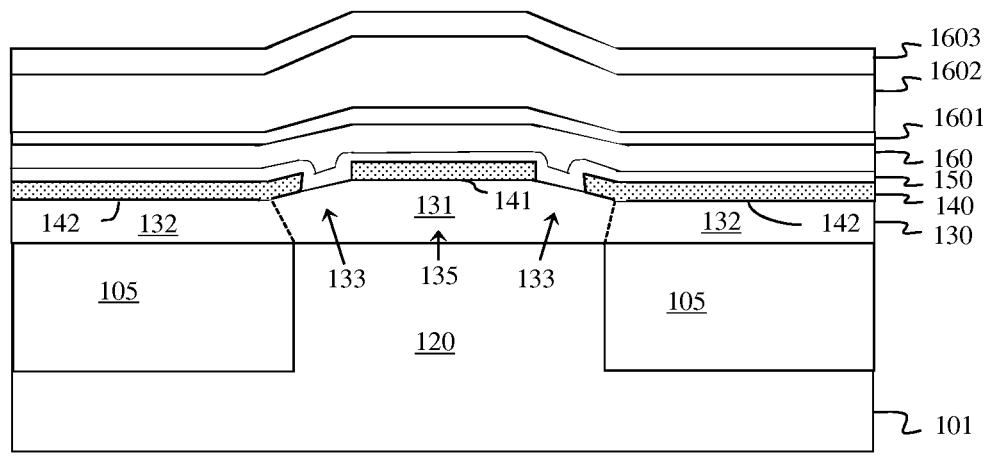
FIG. 16 is a cross-section diagram illustrating a partially completed bipolar device formed according to the flow diagram of FIG. 4.

Specifically, a stack of additional dielectric layers can be formed (e.g., deposited) on the second extrinsic base layer 160. These dielectric layers can comprise, for example, a first dielectric layer 1601 (e.g., a silicon oxide ($SiO_x$) layer) immediately adjacent to the first extrinsic base layer 150, a second dielectric layer 1602 (e.g., a silicon nitride ($SiN_s$) layer) on the first dielectric layer 1602 and a third dielectric layer 1603 (e.g., another silicon oxide ($SiO_x$) layer) on the second dielectric layer 1602 (see FIG. 16).

Figure 17:
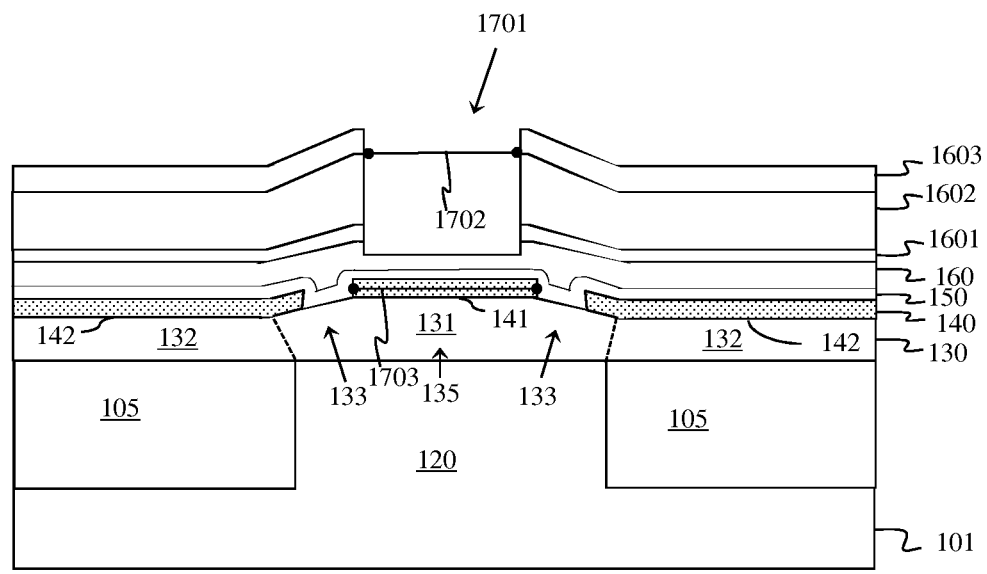
FIG. 17 is a cross-section diagram illustrating a partially completed bipolar device formed according to the flow diagram of FIG. 4.

Then, an upper portion of a second opening 1701 (i.e., an emitter opening) can be formed (e.g., lithographically patterned and etched) such that it extends vertically through the dielectric layers 1601-1603 and into, but not through, the second extrinsic base layer 160 (426, see FIG. 17). This upper portion of the second opening 1701 can have width 1702 that is narrower than the width 1703 of the dielectric landing pad 141.

Figure 18:
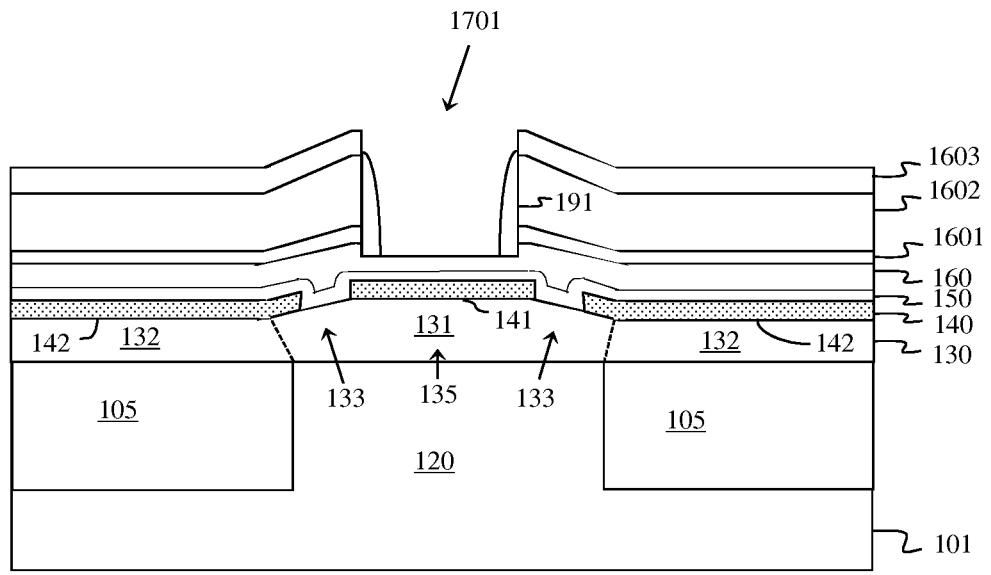
FIG. 18 is a cross-section diagram illustrating a partially completed bipolar device formed according to the flow diagram of FIG. 4.
Figure 19:
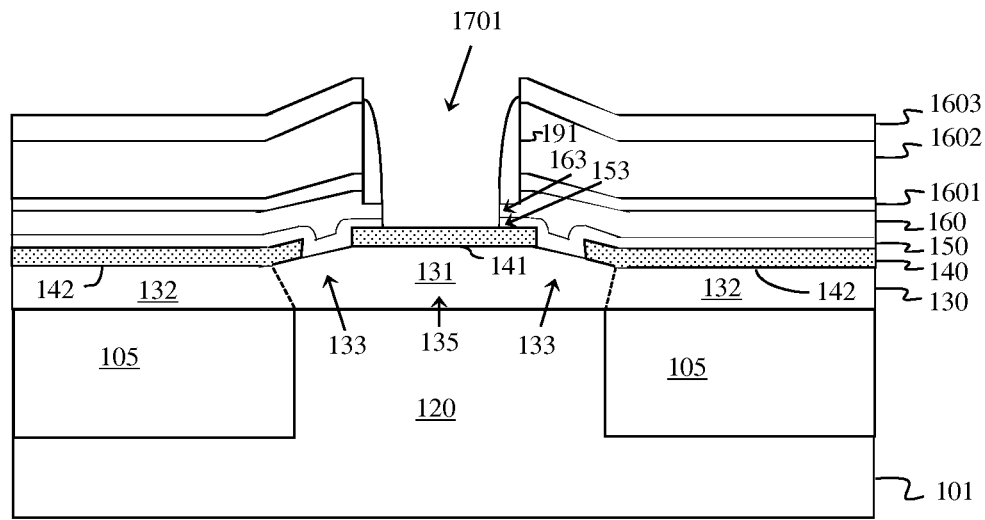
FIG. 19 is a cross-section diagram illustrating a partially completed bipolar device formed according to the flow diagram of FIG. 4.

A first dielectric spacer 191 (e.g., a silicon nitride ($SiN_s$) spacer) can be formed, using conventional sidewall spacer formation techniques, on the sidewall of the upper portion of the second opening 1701 and above the second extrinsic base layer 160 (see FIG. 18). Then, the second opening 1701 can be extended (i.e., further etched) through the remaining second extrinsic base layer 160 and first extrinsic base layer 150 to expose the top surface of the dielectric landing pad 141 as well as vertically aligned sidewalls 163, 153 of the second extrinsic base layer 160 and first extrinsic base layer 150 within the opening 1701 (426, see FIG. 19).

Figure 20:
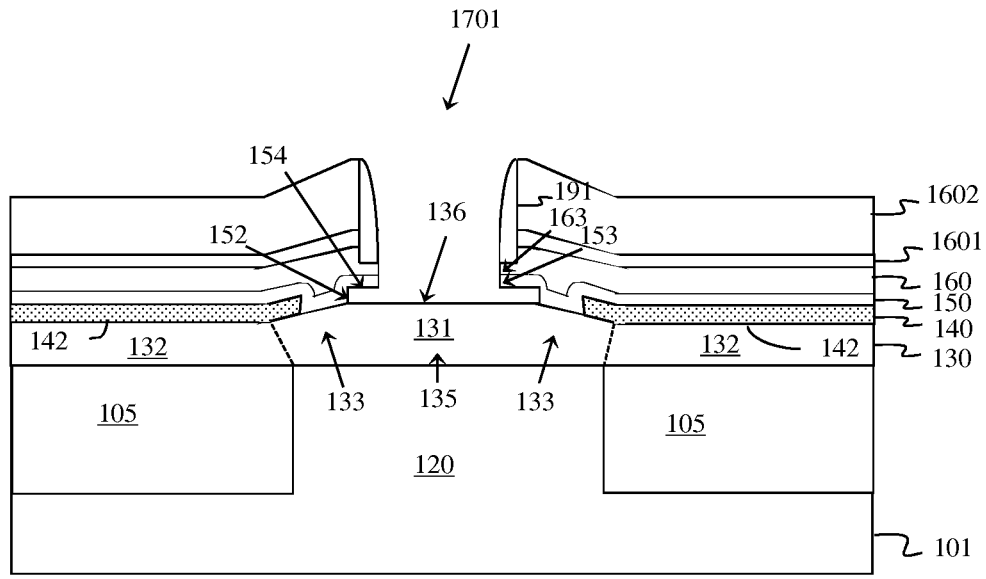
FIG. 20 is a cross-section diagram illustrating a partially completed bipolar device formed according to the flow diagram of FIG. 4.

Next, the dielectric landing pad 141 can be selectively removed (e.g., using a wet etch process) that also removes the silicon oxide ($SiO_x$) layer 1603 (428, see FIG. 20). Since the second opening 1701 had a width 1702 that was less than the width 1703 of the dielectric landing pad 141, removal of the dielectric landing pad 141 will not only expose the top surface 136 of the first center portion 135 of the monocrystalline section 131 of the intrinsic base layer 130 but yet another vertical sidewall 152 of the first extrinsic base layer 150 offset from the vertical sidewall 153 and a bottom surface 154 of the first extrinsic base layer 150 extending laterally between the sidewalls 152 and 153. Thus, etching of the second opening 1701 at process 426 and removal of the dielectric landing pad 141 at process 428 exposes monocrystalline surfaces only of the second extrinsic base layer 160 (see the vertical sidewall 163 of the second extrinsic base layer 160), the first extrinsic base layer 150 (see the vertical sidewalls 152 and 153 and the bottom surface 154 of the first extrinsic base layer 150) and the intrinsic base layer 130 (see the top surface 136 of the first center portion 135 of the monocrystalline section 131 of the intrinsic base layer 130).

Figure 21:
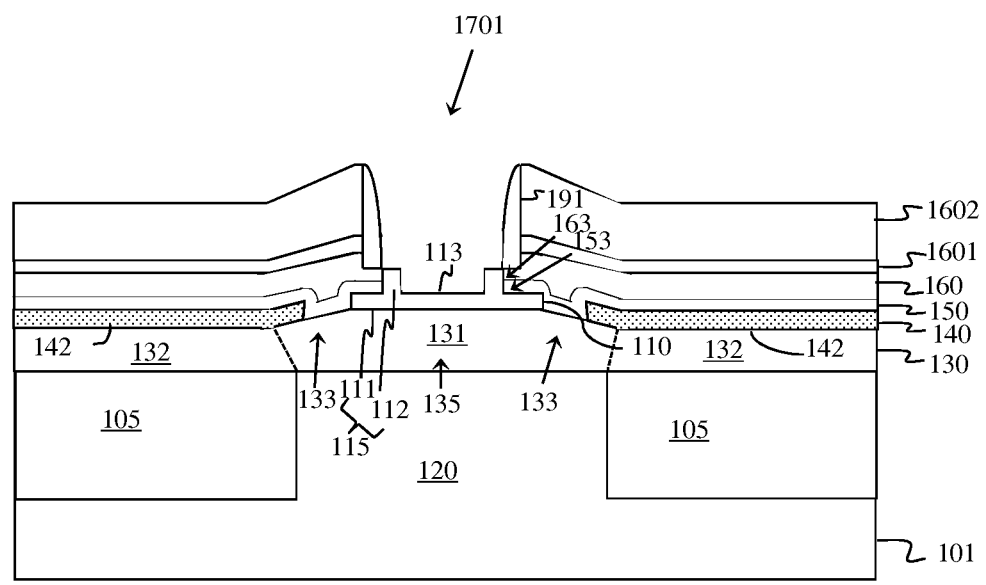
FIG. 21 is a cross-section diagram illustrating a partially completed bipolar device formed according to the flow diagram of FIG. 4.

Then, following removal of the dielectric landing pad 141 at process 428, a semiconductor layer 110 can be epitaxially deposited on the exposed monocrystalline surfaces (430, see FIG. 21). Specifically, a non-selective epitaxial deposition process (e.g., a low temperature epitaxy (LTE) process) can be used to grow epitaxial semiconductor material (e.g., epitaxial silicon in the case of an BJT or epitaxial silicon germanium, silicon germanium carbide or silicon carbide in the case of an HBT) on the exposed monocrystalline surface of the vertical sidewall 163 of the second extrinsic base layer 160, on the exposed monocrystalline surfaces of the vertical sidewalls 152 and 153 of the first extrinsic base layer 150, on the exposed monocrystalline bottom surface 154 of the first extrinsic base layer 150, and on the exposed monocrystalline top surface 136 of the first center portion 135 of the monocrystalline section 131 of the intrinsic base layer 130. Thus, the resulting semiconductor layer 110 will have a second center portion 113, which is above the first center portion 135 of the monocrystalline section 131 of the intrinsic base layer 130; a second edge portion 111, which is positioned laterally adjacent to the second center portion 113, which abuts the vertical sidewall 152 of the first extrinsic base layer 150 and which is stacked vertically between the top surface of the intrinsic base layer 130 and the bottom surface 154 of the first extrinsic base layer 150; and a vertical extension 112, which is above and offset from the second edge portion 111, which extends upward and which is positioned laterally immediately adjacent to vertically aligned sidewalls 153, 163 of the first extrinsic base layer 150 and second extrinsic base layer 160, respectively. Since the epitaxial semiconductor material for semiconductor layer 110 is grown on only monocrystalline surfaces, the semiconductor layer 110 and, particularly, each of the portions 111, 112 and 113 of the semiconductor layer 110 will be entirely monocrystalline in structure. Thus, this techniques ensures the formation of an entirely monocrystalline link-up region 115, which electrically connects the intrinsic base layer 130 and the extrinsic base layers 150, 160 and which comprises the second edge portion 111 and the vertical extension 112 of the semiconductor layer 110.

Additionally, it should be noted that the interfaces between the monocrystalline semiconductor material grown on the different and, particularly, opposing top and bottom monocrystalline surfaces of the intrinsic base layer and first extrinsic base layer, respectively, will be uniform, thereby minimizing the occurrence of voids within the semiconductor layer 110 and, particularly, within the link-up region 115 (i.e., within the portions 111 and 112 of the semiconductor layer 110) that would increase resistance. Optionally, deposition of the semiconductor layer 110 at process 430 can proceed without doping to alter the conductivity type. Alternatively, the semiconductor layer 110 can be in-situ doped or subsequently implanted with a dopant so as to have the first type conductivity (e.g., P-type conductivity) at the same or different conductivity levels than the substrate 101, the intrinsic base layer 130, the first extrinsic base layer 150 and/or second extrinsic base layer 160.

It should be noted that in the process steps described above and illustrated in FIG. 4, the intrinsic base layer 130, the first extrinsic base layer 150, the second extrinsic base layer 160 and the semiconductor layer 110 can each be formed so as to comprise the same semiconductor material (e.g., silicon, silicon germanium, silicon carbide or silicon germanium carbide). Alternatively, any two or more of the layers 130, 150, 160 and 110 may be formed so as to comprise different semiconductor materials (e.g., silicon and silicon germanium, silicon carbide or silicon germanium carbide; silicon germanium and silicon carbide or silicon germanium carbide, etc.). Furthermore, any one or more of the layers 130, 150, 160 and 110 may be undoped or doped so as to have the same conductivity type at a different conductivity level than the other layers.

In order to complete the bipolar device, additional process steps 432 can be performed in order to form the following features described in detail above with regard to the structure embodiments including, but not limited to: an emitter layer 180, dielectric spacer(s) 192-193, metal silicide layer(s) 170, interlayer dielectric(s) 195, contacts 196, etc.

Figure 22:
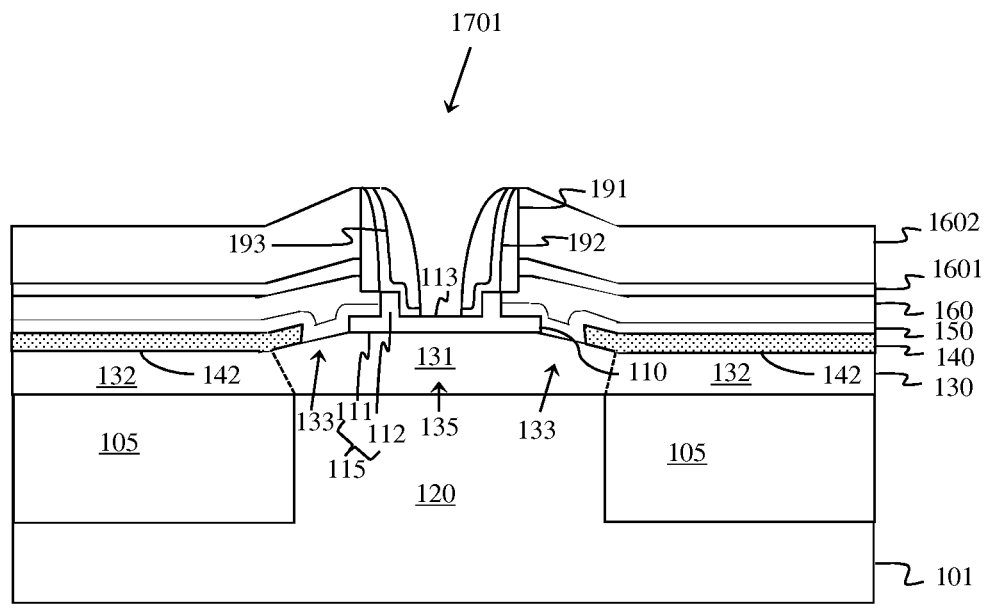
FIG. 22 is a cross-section diagram illustrating a partially completed bipolar device formed according to the flow diagram of FIG. 4.
Figure 23:
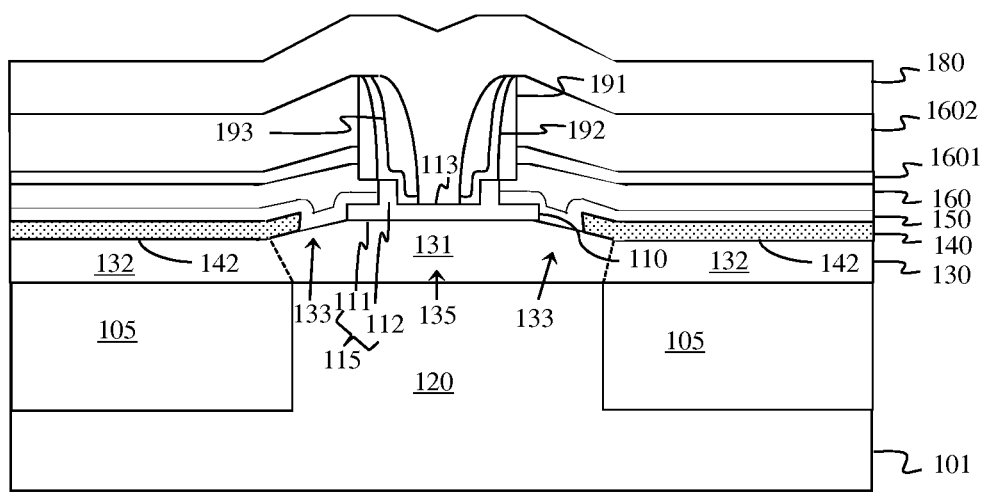
FIG. 23 is a cross-section diagram illustrating a partially completed bipolar device formed according to the flow diagram of FIG. 4.

For example, a conformal dielectric layer (e.g., a silicon oxide ($SiO_x$) layer) can be deposited so as to line the second opening 1701 and yet another dielectric layer (e.g., a silicon nitride ($SiN_x$) layer) can be deposited on the conformal dielectric layer. Then, etch processes can be performed so as to expose the second center portion 113 of the semiconductor layer 110, thereby creating a second dielectric spacer 192 and a third dielectric spacer 193 (see FIG. 22). The second dielectric spacer 192 (e.g., a silicon oxide ($SiO_x$) spacer) can be positioned laterally adjacent to the first dielectric spacer 191 and can further cover the top surface of the semiconductor layer vertical extension 112 as well as the sidewall of the semiconductor layer vertical extension 112 opposite the vertically aligned sidewalls 153, 163 of the first extrinsic base layer 150 and second extrinsic base layer 160. The third dielectric spacer 193 (e.g., a silicon nitride ($SiN_x$) spacer) can be positioned laterally adjacent to the second dielectric spacer 192. Next, an emitter layer 180 can be deposited so as to fill the second opening 1701 (see FIG. 23). The emitter layer 180 can comprise, for example, a polycrystalline semiconductor layer (e.g., a polycrystalline silicon layer) that is in-situ doped or subsequently implanted with a dopant so as to have the same second type conductivity as the collector region 120 (e.g., N-type conductivity).

Next, conventional processing techniques can be used to pattern and etch the emitter layer 180 to create the conventional T-shape, to form optional metal silicide layer(s) 170 on the top surfaces of the extrinsic base layer 160 and emitter layer 180, to cover the bipolar device with one or more interlayer dielectric(s) 195, to form contacts 196 to the second extrinsic base layer 160 and emitter layer 180, etc. (see FIGS.

1-3). Various different techniques for forming these features are well known in the art and, thus, are omitted from this specification in order to allow the reader to focus on the salient aspects of the method embodiments. However, it should be understood that any of these various techniques could be incorporated into the different method embodiments disclosed.

It should be noted that in the structure and method embodiments described above, the first type conductivity is referred to as being P-type conductivity and the second type conductivity is referred to as being N-type conductivity. However, alternatively, the reverse can be true. That is, the first type conductivity can comprise N-type conductivity and the second type conductivity can comprise P-type conductivity. Those skilled in the art will recognize that different dopants can be used to achieve the different conductivity types and that the dopants may vary depending upon the different semiconductor materials used. For example, a silicon-based semiconductor material having N-type conductivity is typically doped with an N-type dopant (e.g., a Group V dopant, such as arsenic (As), phosphorous (P) or antimony (Sb)), whereas a silicon-based semiconductor material having P-type conductivity is typically doped with a P-type dopant (e.g., a Group III dopant, such as boron (B) or indium (In)). Alternatively, a gallium nitride (GaN)-based semiconductor material having P-type conductivity is typically doped with magnesium (Mg), whereas a gallium nitride (GaN)-based semiconductor material having an N-type conductivity is typically doped with silicon (Si). Those skilled in the art will also recognize that different conductivity levels of the different bipolar device components will depend upon the relative concentration levels of the dopants.

It should be understood that the terminology used herein is for the purpose of describing particular embodiments only and is not intended to be limiting. As used herein, the singular forms "a", "an" and "the" are intended to include the plural forms as well, unless the context clearly indicates otherwise. It should further be understood that the terms "comprises" "comprising", "includes" and/or "including", as used in this specification, specify the presence of stated features, integers, steps, operations, elements, and/or components, but do not preclude the presence or addition of one or more other features, integers, steps, operations, elements, components, and/or groups thereof. Additionally, it should be understood that the corresponding structures, materials, acts, and equivalents of all means or step plus function elements in the claims below are intended to include any structure, material, or act for performing the function in combination with other claimed elements as specifically claimed. The above-description has been presented for purposes of illustration, but is not intended to be exhaustive or limiting. Many modifications and variations will be apparent to those of ordinary skill in the art without departing from the scope and spirit of the disclosed embodiments.

Therefore, disclosed above are embodiments of a bipolar device, such as a bipolar junction transistor (BJT) or heterojunction bipolar transistor (HBT), incorporating a link-up region that is entirely monocrystalline in structure and electrically connects a monocrystalline section of an intrinsic base layer with monocrystalline semiconductor extrinsic base layers for a reduction in overall base resistance $R_b$ for a higher $f_{max}$. Also disclosed herein are embodiments of a method of forming such a bipolar device. In these method embodiments, a first extrinsic base layer, which is initially amorphous or polycrystalline, can be deposited such that it contacts an edge portion of a monocrystalline section of an intrinsic base layer through an opening in a dielectric layer. A second extrinsic base layer can be deposited on the first extrinsic base layer. An anneal process can be performed, either before or after epitaxial deposition of the second extrinsic base layer, to ensure that the extrinsic base layers are both monocrystalline. An emitter opening can then be formed through the extrinsic base layers to a dielectric landing pad, which is aligned above a center portion of the monocrystalline section of the intrinsic base layer. The dielectric landing pad can be selectively removed and, following removal of the dielectric landing pad, a semiconductor layer can be epitaxially deposited on exposed monocrystalline surfaces only of the extrinsic base layers and the intrinsic base layer, thereby forming a link-up region, which is entirely monocrystalline in structure, between the intrinsic base layer and the extrinsic base layers.

What is claimed is:

1. A bipolar device comprising:
   an intrinsic base layer comprising:
      a monocrystalline section having a first center portion and a first edge portion positioned laterally adjacent to said first center portion; and
      a polycrystalline section positioned laterally adjacent to said first edge portion;
   a dielectric layer on said polycrystalline section;
   a semiconductor layer on said first center portion and having a second center portion, a second edge portion positioned laterally adjacent to said second center portion and a vertical extension offset from said second edge portion; and
   multiple extrinsic base layers comprising:
      a first extrinsic base layer on said dielectric layer and further extending laterally over top surfaces of said first edge portion and said second edge portion to said vertical extension; and
      a second extrinsic base layer on said first extrinsic base layer and extending laterally to said vertical extension such that said first extrinsic base layer and said second extrinsic base layer have vertically aligned sidewalls,
   said second edge portion and said vertical extension of said semiconductor layer being an entirely monocrystalline link-up region between said intrinsic base layer and said multiple extrinsic base layers.

2. The bipolar device of claim 1, said first extrinsic base layer and said second extrinsic base layer being entirely monocrystalline.

3. The bipolar device of claim 1, said first extrinsic base layer and said second extrinsic base layer having additional vertically aligned sidewalls above said dielectric layer.

4. The bipolar device of claim 1, said intrinsic base layer, said first extrinsic base layer, said second extrinsic base layer and said semiconductor layer comprising a same semiconductor material.

5. The bipolar device of claim 1, wherein at least two of said intrinsic base layer, said first extrinsic base layer, said second extrinsic base layer and said semiconductor layer comprising different semiconductor materials.

6. The bipolar device of claim 1, said dielectric layer comprising silicon oxide.

7. The bipolar device of claim 1, further comprising an emitter layer on said second center portion.

8. A bipolar device comprising:
   an intrinsic base layer comprising:
      a monocrystalline section having a first center portion and a first edge portion positioned laterally adjacent to said first center portion; and
      a polycrystalline section positioned laterally adjacent to said first edge portion;
   a dielectric layer on said polycrystalline section;

a semiconductor layer on said first center portion and having a second center portion, a second edge portion positioned laterally adjacent to said second center portion and a vertical extension offset from said second edge portion; and, multiple extrinsic base layers comprising:
- a first extrinsic base layer on said dielectric layer and further extending laterally over top surfaces of said first edge portion and said second edge portion to said vertical extension; and
- a second extrinsic base layer comprising an additional monocrystalline section on said first extrinsic base layer and extending laterally to said vertical extension such that said first extrinsic base layer and said second extrinsic base layer have vertically aligned sidewalls, said first extrinsic base layer further having an additional sidewall on said dielectric layer, said second extrinsic base layer further extending laterally beyond said additional sidewall and comprising an additional polycrystalline section above said dielectric layer and positioned laterally adjacent to said additional monocrystalline section, and said second edge portion and said vertical extension of said semiconductor layer being an entirely monocrystalline link-up region between said intrinsic base layer and said multiple extrinsic base layers.

9. The bipolar device of claim 8, said intrinsic base layer, said first extrinsic base layer, said second extrinsic base layer and said semiconductor layer comprising a same semiconductor material.

10. The bipolar device of claim 8, wherein at least two of said intrinsic base layer, said first extrinsic base layer, said second extrinsic base layer and said semiconductor layer comprising different semiconductor materials.

11. The bipolar device of claim 8, said dielectric layer comprising silicon oxide.

12. The bipolar device of claim 8, further comprising an emitter layer on said second center portion.

* * * * *